(12) United States Patent
Kautzsch et al.

(10) Patent No.: US 9,236,241 B2
(45) Date of Patent: Jan. 12, 2016

(54) WAFER, A METHOD FOR PROCESSING A WAFER, AND A METHOD FOR PROCESSING A CARRIER

(71) Applicant: Infineon Technologies Dresden GmbH, Dresden (DE)

(72) Inventors: Thoralf Kautzsch, Dresden (DE); Alessia Scire, Dresden (DE); Steffen Bieselt, Wehlen (DE); Uwe Rudolph, Dresden (DE); Marco Mueller, Pirna (DE); Boris Binder, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 5 days.

(21) Appl. No.: 14/269,260

(22) Filed: May 5, 2014

(65) Prior Publication Data
US 2015/0318166 A1 Nov. 5, 2015

(51) Int. Cl.
*H01L 21/302* (2006.01)
*H01L 21/02* (2006.01)

(52) U.S. Cl.
CPC .............................. *H01L 21/02002* (2013.01)

(58) Field of Classification Search
CPC ............ H01L 21/762; H01L 21/76831; H01L 21/3212; H01L 21/67063; H01L 21/67069; H01L 21/242; H01L 21/02126; H01L 21/31116; H01L 21/02332; H01L 21/046; H01L 21/265; H01L 27/0922
USPC ......... 438/700, 637, 199, 311, 510, 513, 474, 438/475, 663, 692, 712; 257/E21.006, 257/E21.014, E21.043, E21.077, E21.134, 257/E21.218, E21.227, E21.229, E21.245, 257/E21.248, E21.267, E21.304, E21.32, 257/E21.545, E21.548
See application file for complete search history.

(56) References Cited

U.S. PATENT DOCUMENTS

| 2015/0162253 A1* | 6/2015 | Bieselt | 438/637 |
| 2015/0162254 A1* | 6/2015 | Bieselt | 438/700 |

OTHER PUBLICATIONS

K. Van Nieuwenhuysen et al. "Progress in epitaxial deposition on low-cost substrates for thin-film crystalline silicon solar cells at IMEC" Journal of Crystal Growth 287 (2006) 438-441.
M. Zimmermann et al. "A Seamless Ultra-Thin Chip Fabrication and Assembly Process" Proc. IEDM 2006, pp. 1100-1012, 2006.
M. Zimmermann et al. "Ultra-Thin Chip Fabrication and Assembly Process" Proc. SAFE 2008 Technology and Materials, pp. 531-534, 2008.
http://www.ims-chip.de/ Dr. Martin Zimmermann White paper Chipfilm, pp. 1-6, 2011.

* cited by examiner

*Primary Examiner* — David Nhu

(57) ABSTRACT

According to various embodiments, a method for processing a wafer may include: forming at least one hollow chamber and a support structure within the wafer, the at least one hollow chamber defining a cap region of the carrier located above the at least one hollow chamber and a bottom region of the carrier located below the at least one hollow chamber and an edge region surrounding the cap region of the carrier, wherein a surface area of the cap region is greater than a surface area of the edge region, and wherein the cap region is connected to the bottom region by the support structure; removing the cap region in one piece from the bottom region and the edge region.

20 Claims, 14 Drawing Sheets

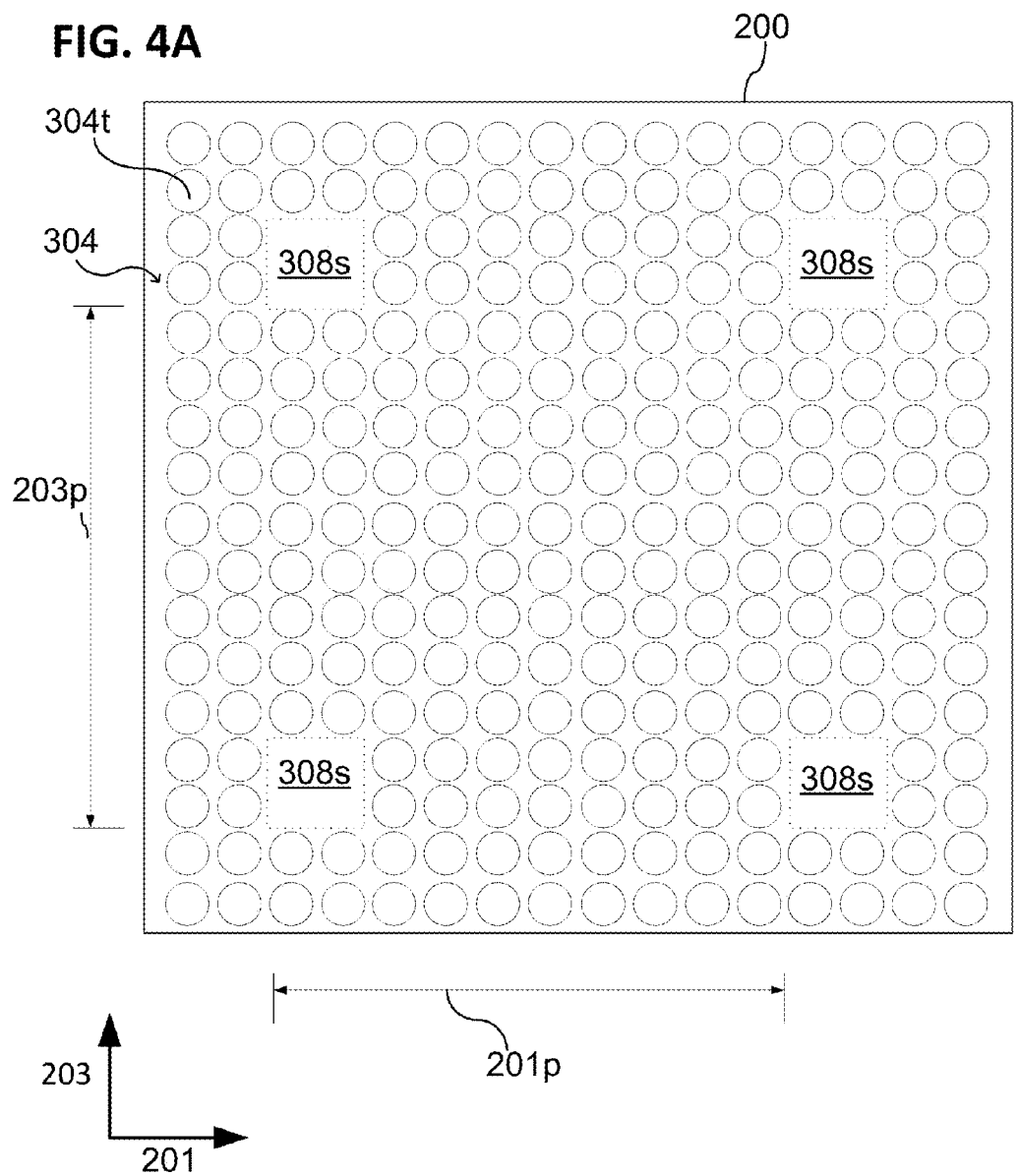

FIG. 4B
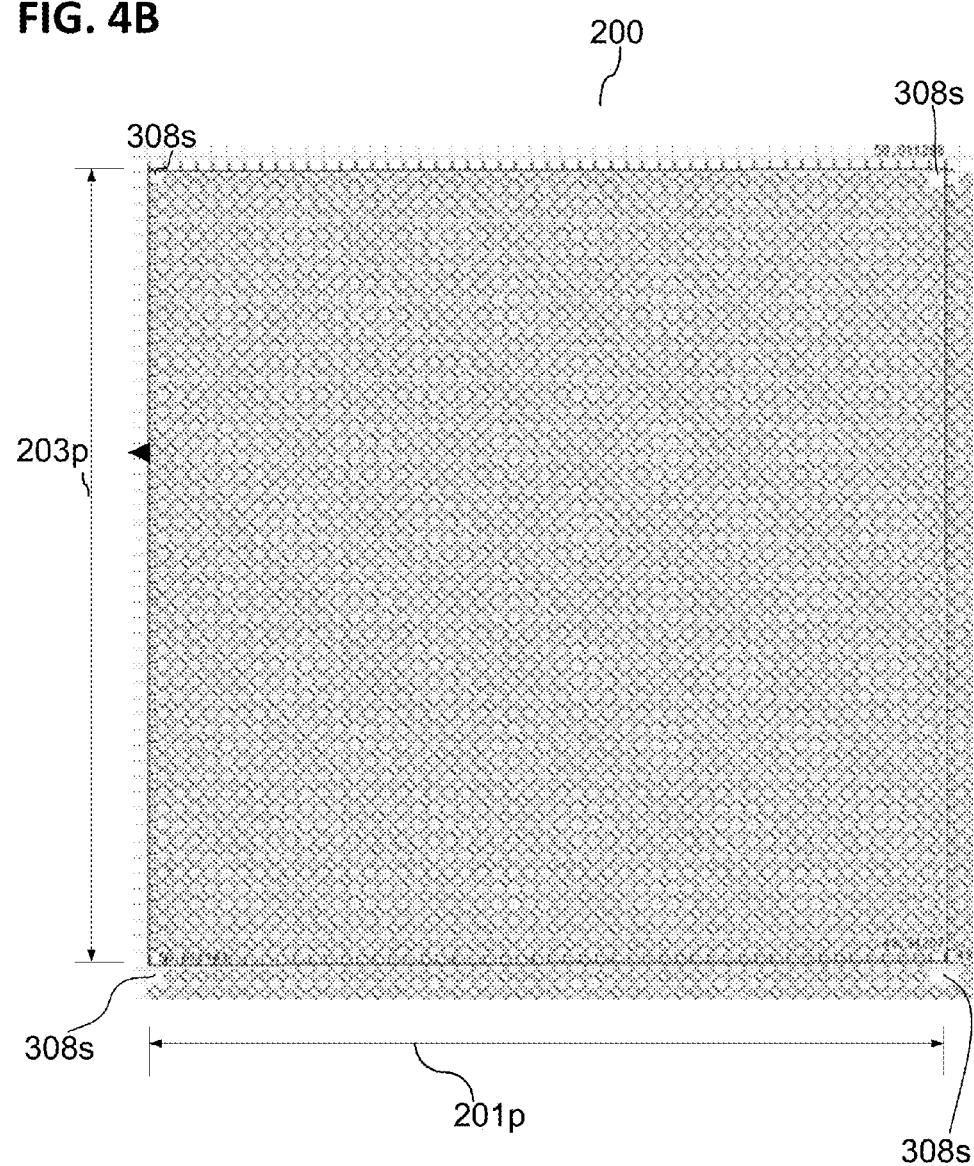
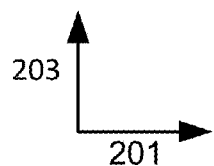

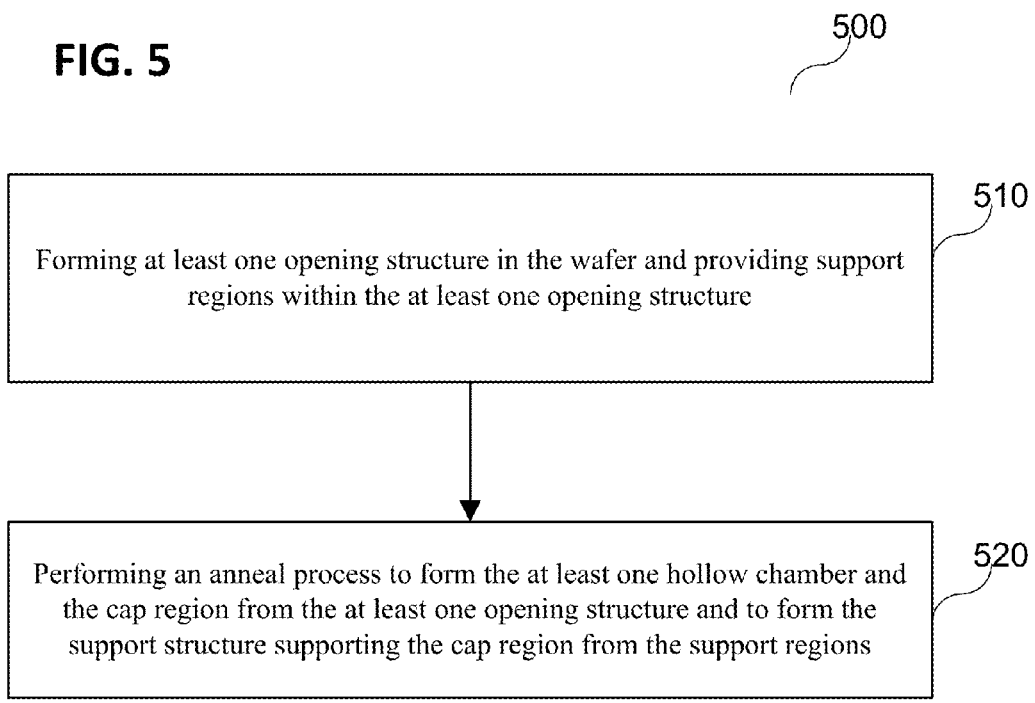
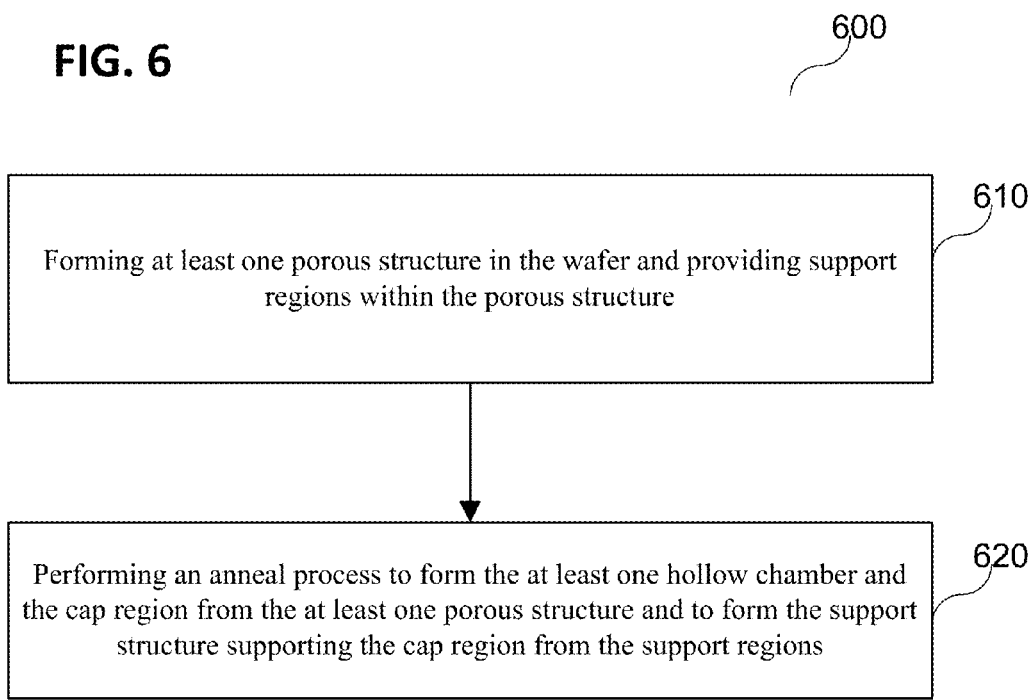

WAFER, A METHOD FOR PROCESSING A WAFER, AND A METHOD FOR PROCESSING A CARRIER

TECHNICAL FIELD

Various embodiments relate generally to a wafer, a method for processing a wafer, and a method for processing a carrier.

BACKGROUND

In general, there may be a variety of applications in microelectronics, microsystems, biomedical, and other fields for thin chips or ultra-thin chips being formed for example on a carrier having a thickness in the range of about several tens of micrometers, e.g. on a silicon wafer with a thickness less than about 50 μm. One method for fabricating thin or ultra-thin wafers may be wafer grinding. Wafer grinding techniques as commonly applied for thinning wafers based on a mechanical treatment of the wafer may introduce defects into the wafer, and may be difficult to control, which may lead to yield loss and therefore high cost. However, there may be attempts for manufacturing ultra-thin chips based on wafer pre-processing, wherein after the CMOS processing each single chip of a plurality of ultra-thin chips may be removed separately from the pre-processed wafer via a so-called Pick, Crack & Place™ process.

SUMMARY

According to various embodiments, a method for processing a wafer may include: forming at least one hollow chamber and a support structure within the wafer, the at least one hollow chamber defining a cap region of the carrier located above the at least one hollow chamber and a bottom region of the carrier located below the at least one hollow chamber and an edge region surrounding the cap region of the carrier, wherein a surface area of the cap region is greater than a surface area of the edge region, and wherein the cap region is connected to the bottom region by the support structure; removing the cap region in one piece from the bottom region and the edge region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4A and 4B respectively show a schematic top view of a wafer or a patterning layout, according to various embodiments;

FIG. 5 and FIG. 6 respectively show a schematic flow diagram of a method for forming at least one hollow chamber and a support structure within a wafer, according to various embodiments;

DESCRIPTION

Figure 1:
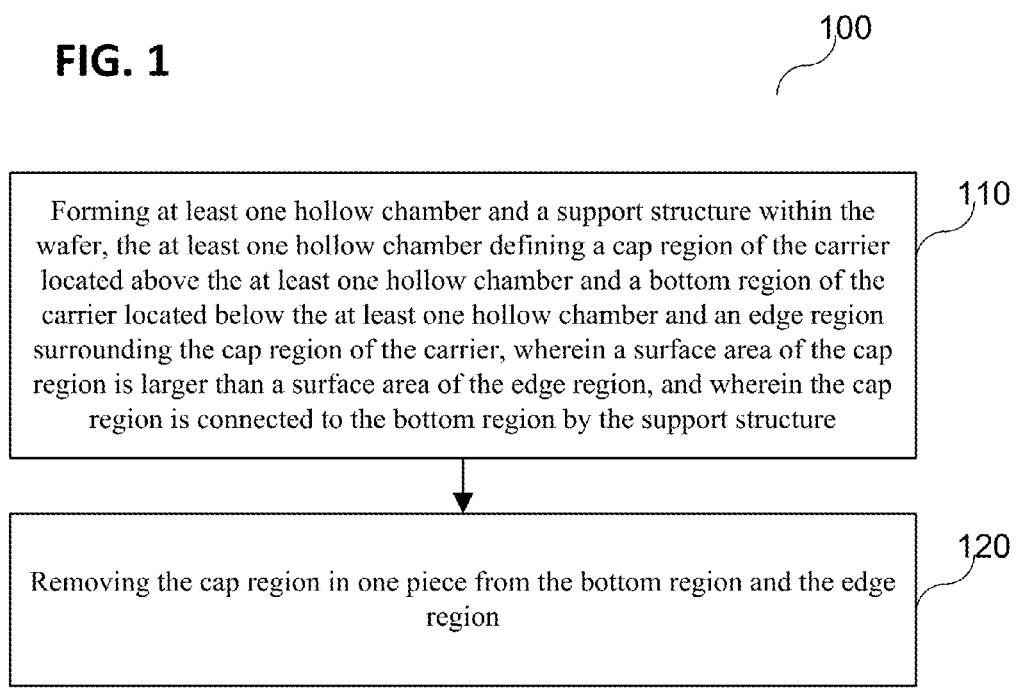
FIG. 1 shows a schematic flow diagram of a method for processing a wafer, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a carrier or wafer), a lateral direction, or "laterally" adjacent, may be used herein to mean an extension along a direction parallel to a surface of a carrier or a direction parallel to a surface of a wafer. That means, a surface of a carrier (e.g. a surface of a substrate, or a surface of a wafer) may serve as reference, commonly referred to as the main processing surface of a carrier or a wafer (or the main processing surface of another type of carrier). Further, the term "width" used with regards to a "width" of a structure (or of a structure element, e.g. a cavity, e.g. a hollow chamber) may be used herein to mean the lateral extension of a structure. Further, the term "height" used with regards to a height of a structure (or of a structure element), may be used herein to mean an extension of a structure along a direction perpendicular to the surface of a carrier or wafer (e.g. perpendicular to the main processing surface of a carrier or wafer). Further, the term "depth" used with regards to a depth of a recess (or of a structure element), may be used herein to mean an extension of a recess along a direction perpendicular to the surface of a carrier or wafer (e.g. perpendicular to the main processing surface of a carrier or wafer). Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

The word "cover" used with regards to deposited material covering a structure (or a structure element), may be used herein to mean that a deposited material may cover a structure (or a structure element) completely, e.g. covering all exposed sides and surfaces of a structure. The word "cover" used with regards to deposited material covering a structure (or a structure element), may be used herein to mean that the deposited material may cover a structure at least partially, e.g. a material may at least partially cover the exposed sides and surfaces of a structure.

According to various embodiments, a hollow chamber may for example be also filled with a material, e.g. a hollow chamber in a silicon wafer may be filled or partially filled with silicon oxide. Therefore, the term "hollow" used with regards to a "hollow" chamber may be used herein to mean that the hollow chamber itself (e.g. a cavity, e.g. a void, e.g. a hollow structure) may be free of material. However, a hollow chamber may be partially filled with a filling material, or may be completely filled with a filling material. Referring to this, the hollow chamber may be partially filled or completely filled with another material than the material providing the hollow chamber.

According to various embodiments, a method for processing a wafer or a method for processing a carrier, as described herein, may include several basic semiconductor manufacturing techniques, layering (via a chemical vapor deposition or physical vapor deposition), patterning (e.g. including lithographic process and etching processes, e.g. wet etching or dry etching), a heat treatment or an anneal process (e.g. including rapid thermal processing, heating with a lamp or a laser, and the like), doping (e.g. via ion implantation and/or diffusion), planarization (chemical mechanical polishing), and the like, which may be used at least once in the overall manufacturing process or at least once during processing of the carrier or wafer.

According to various embodiments, a patterning process may be performed for forming openings, recesses, trenches, or holes at desired positions into a carrier (or wafer) or into a surface layer of a carrier (or of a wafer), wherein the patterning may include forming a patterned layer (e.g. a hard mask layer (e.g. including silicon nitride) or a soft mask layer (e.g. including a resist)) and performing an etching or an etch process to locally remove the respective material.

According to various embodiments, a method for processing a wafer (or a carrier) is described for manufacturing a thin or ultra-thin wafer. Therefore, a so-called silicon-on-nothing-(SON)-process (also called venezia process or venetia process) or the so-called empty space in silicon technique may be utilized, wherein a hollow chamber (an empty space or a cavity) is formed in a wafer or carrier by forming an opening structure and performing a high temperature process to form a buried planar hollow chamber or a buried tube-like hollow chamber from the opening structure. Illustratively, the opening structure may be transformed via an annealing process into one or more hollow chambers, wherein the shape, size and position of the one or more hollow chambers may be defined by the design of the opening structure and the process parameters of the annealing. However, commonly used carrier designs and silicon-on-nothing processes may not allow forming a hollow chamber with a large lateral extension, e.g. greater than several tens of micrometers, due to the complex diffusion and/or migration based forming process.

According to various embodiments, a carrier (e.g. a wafer) may be patterned in such a way, that after an anneal process at least one hollow chamber with a large lateral extension is provided within the carrier, wherein the hollow chamber is covered with a cap region or a cap layer formed by carrier material diffusing and/or migrating during the anneal process. The at least one hollow chamber may laterally extend substantially through the whole carrier. Therefore, the patterning of the carrier may be consider providing a support structure such that the cap region formed during the annealing may be supported via the support structure such that a hollow chamber with a large lateral extension can be provided.

Alternatively, according to various embodiments, a hollow chamber may be provided via forming a porous structure in the carrier of wafer, and performing an anneal process to form the hollow chamber and a cap region covering the hollow chamber from the porous structure. Further, a support structure may be provided such that a hollow chamber with a large lateral extension can be provided.

FIG. 1 shows a schematic flow diagram of a method 100 for processing a wafer (or e.g. a carrier in wafer size and/or shape), according to various embodiments, wherein the method 100 may include: in 110, forming at least one hollow chamber and a support structure within the wafer, the at least one hollow chamber defining a cap region of the wafer located above the at least one hollow chamber and a bottom region of the wafer located below the at least one hollow chamber and an edge region surrounding the cap region of the wafer, wherein a surface area of the cap region is greater than a surface area of the edge region, and wherein the cap region is connected to the bottom region by the support structure; and, in 120, removing (e.g. pulling off or tearing off) the cap region in one piece from the bottom region and the edge region.

Figure 2A:
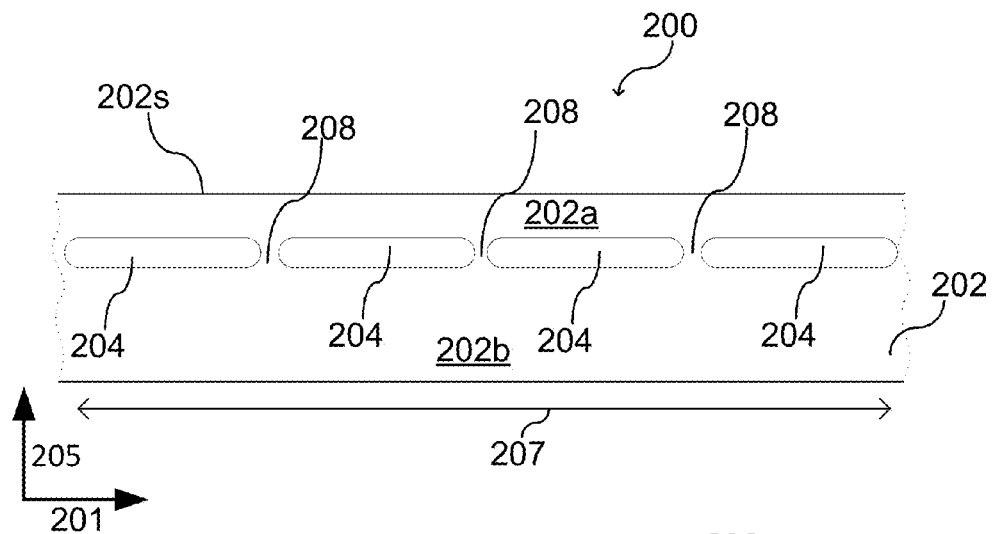
FIG. 2A shows a schematic cross sectional view or side view of a wafer, according to various embodiments.
Figure 2B:
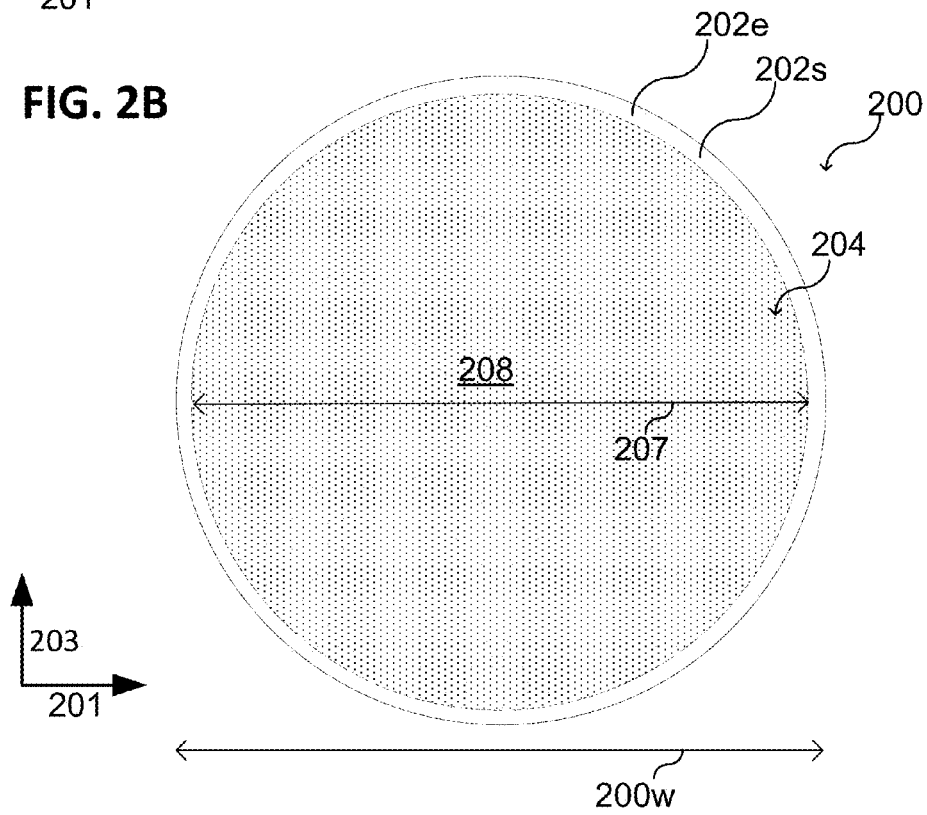
FIG. 2B shows a schematic top view of a wafer, according to various embodiments.
Figure 2C:
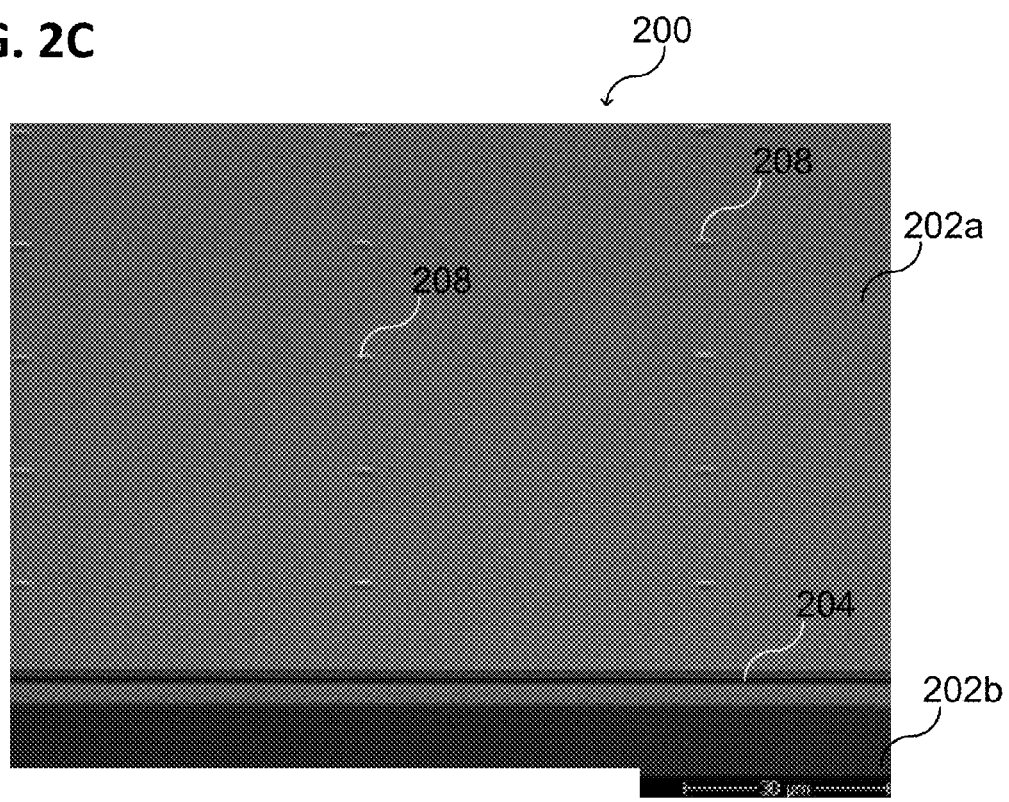
FIGS. 2C and 2D respectively show a scanning electron microscopy image (SEM-image) of a wafer, according to various embodiments.
Figure 2D:
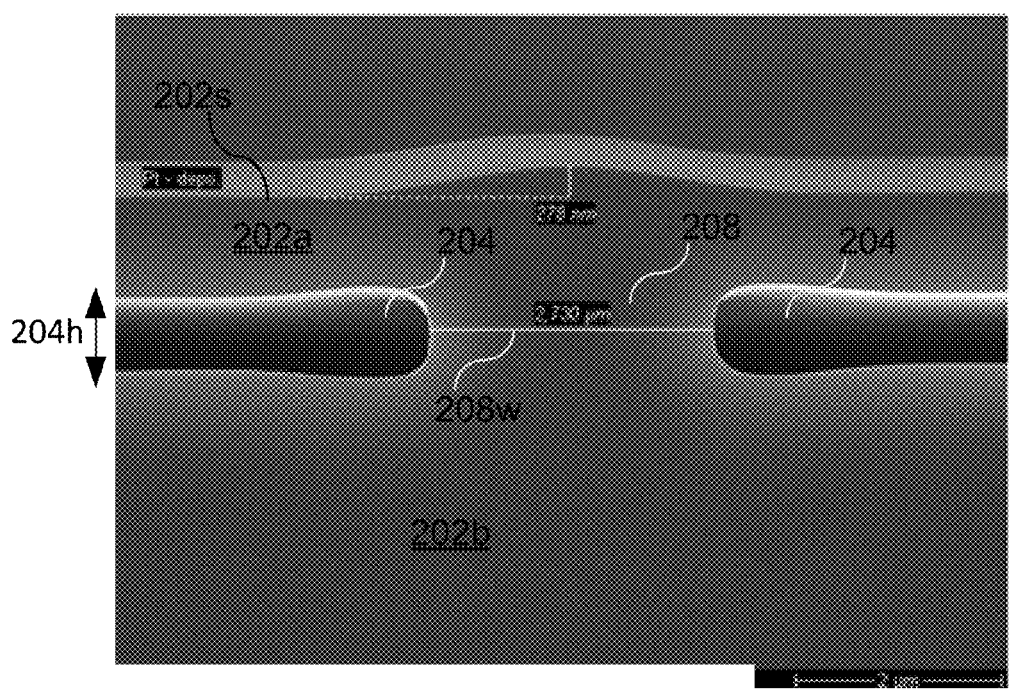
Figure 2E:
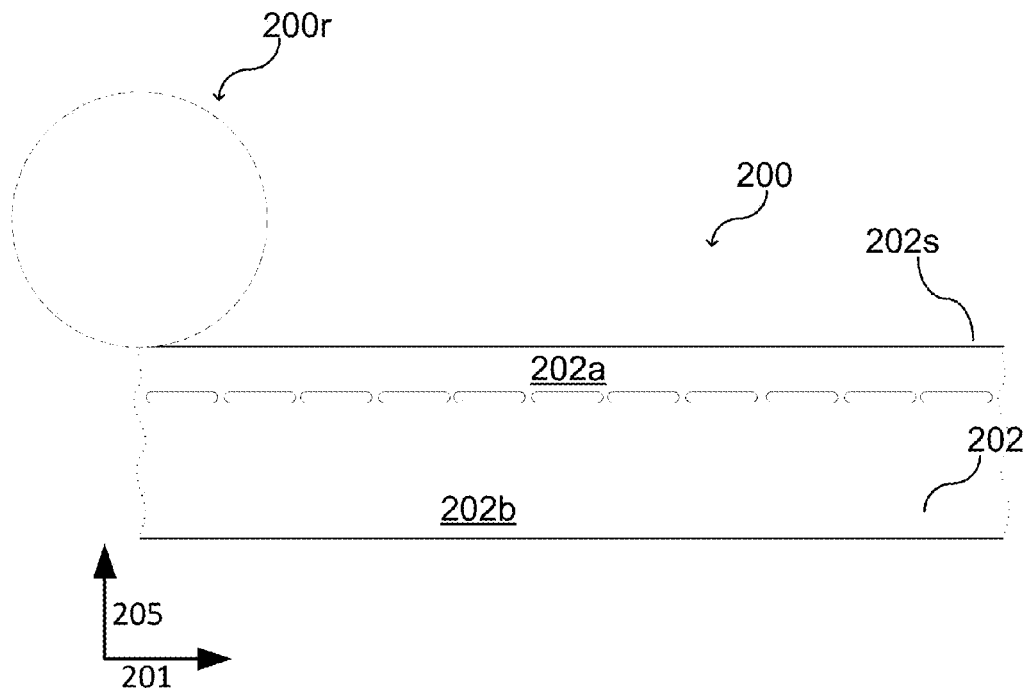
FIGS. 2E and 2F respectively show a schematic cross sectional view or side view of a wafer at different stages during processing, according to various embodiments.
Figure 2F:
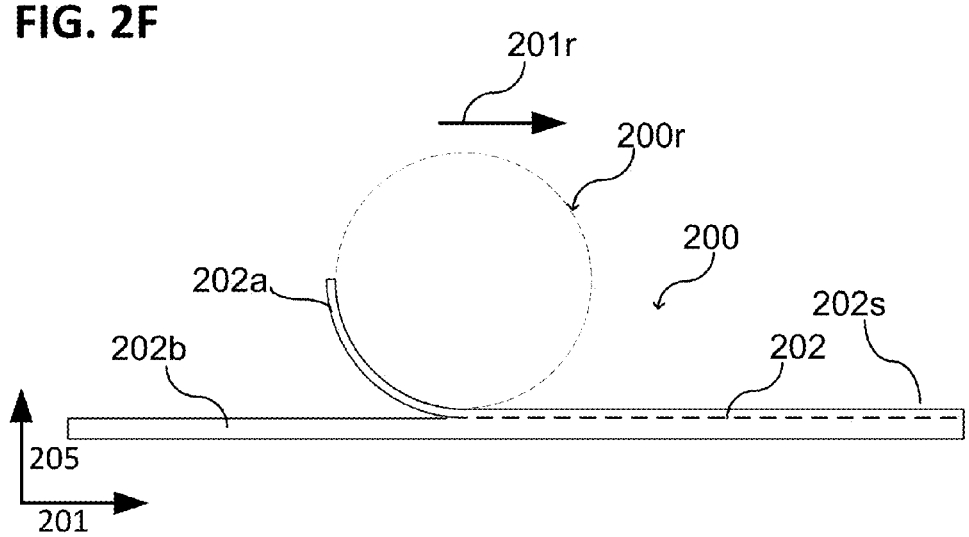
Figure 2G:
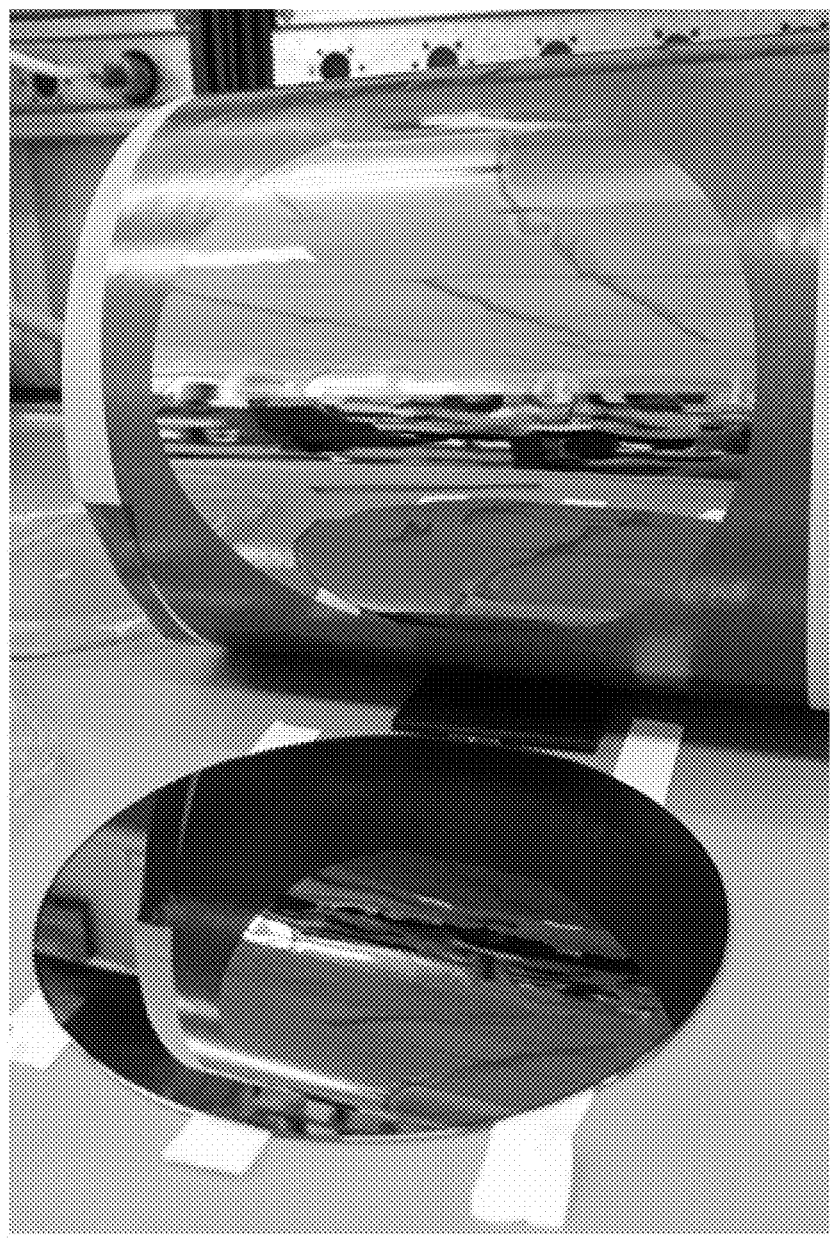
FIG. 2G shows an image of a wafer after processing, according to various embodiments.

The FIGS. 2A to 2D respectively illustrate a wafer 200 during processing, e.g. during process 110 of method 100 is carried out or after process 110 of method 100 has been carried out, and the FIGS. 2E to 2G respectively illustrate a wafer 200 during processing, e.g. during process 120 of method 100 is carried out or after process 120 of method 100 has been carried out.

FIG. 2A shows a section of a wafer 200 after at least one hollow chamber 204 and a support structure 208 has been formed within the wafer 200, according to various embodiments. The wafer 200 may have a surface 202s, which may be a main processing surface of the wafer 200 or a main processing surface of the cap region 202a, after the cap region 202a is removed from the wafer 200. According to various embodiments, the surface 202s may be formed during process 110 of method 100, as described referring to FIGS. 3A to 3D.

As illustrated in FIG. 2A, the at least one hollow chamber 204 defines a cap region 202a of the wafer 200 (a first region 202a of the wafer 200) above (or over) the hollow chamber 204 and a bottom region 202b of the wafer 200 (a second region 202a of the wafer 200). Illustratively, the at least one hollow chamber 204 spatially separates a cap region 202a (a first region) of the wafer 200 and a bottom region 202b (a second region) of the wafer 200. The at least one hollow chamber 204 may laterally extend within the wafer 200 in a plane (201, 203) perpendicular to a thickness direction 205 of the wafer 200. According to various embodiments, the hollow chamber 204 may be a single cavity including a support structure 208 (e.g. a plurality of support structure elements 208) extending within the hollow chamber 204. The hollow chamber 204 may have a lateral extension 207 greater than about 100 μm, wherein the lateral extension 207 may be limited by the lateral extension of the wafer 200 (e.g. considering the edge region). The support structure elements 208 may vertically connect the cap region 202a of the wafer 200 with the bottom region 202b of the wafer 200, thereby carrying or supporting the cap region 202a. The cap region 202a may be a layer 202a providing the surface 202s of the wafer 200 after the hollow chamber 204 has been formed, wherein the cap region 202a is stabilized via the support structure 208.

Alternatively, the support structure elements 208 may be provided by forming a plurality of hollow chambers 204 in the wafer 200. In this case, the support structure 208 may be regarded as carrier material 208 or wafer material 208 remaining between respectively adjacent hollow chambers 204 of the plurality of hollow chambers 204. According to various embodiments, the hollow chambers 204 of the plurality of hollow chambers 204 may have any suitable shape which can be provided for example via a venetia process or via another process for forming hollow chambers 204 within the wafer 200, e.g. plate-shape hollow chambers 204, cylindrical hollow chambers 204 and/or spherical hollow chambers 204 may be provided within the wafer 200.

In case the hollow chamber 204 is a single hollow chamber 204 the support structure 208 may include (e.g. cylindrical-shaped or prismatic) support structure elements 208 extending substantially vertical (along the direction 205) through the hollow chamber 204, wherein the support structure elements 208 may be laterally surrounded by nothing (not by a solid material).

As illustrated in FIG. 2B in a top view of the wafer 200, according to various embodiments, the hollow chamber 204 may laterally undermine (hollows out) a large part of the wafer 200 or a large part of the surface 202s of the wafer 200, wherein the hollow chamber 204 may be laterally surrounded by the edge region 202e and wherein the hollow chamber 204 may be supported by the support structure 208. Accordingly, the cap region 202a may be laterally surrounded by the edge region 202e and the bottom region 202b may be laterally surrounded by the edge region 202e. The edge region 202e may extend from the surface 202s of the wafer to the backside of the wafer 200 (the backside of the wafer 200 being opposite to the surface 202s of the wafer 200). Illustratively, according to various embodiments, the at least one hollow chamber 204 separates the front-side 202s of the wafer 200 from the backside (opposite to the front-side 202s) of the wafer 200. According to various embodiments, for efficiently performing method 100 for manufacturing a thin or ultra-thin wafer (e.g. provided by the removed cap region 202a) the area of the edge region 202e (e.g. seen from the top as illustrated in FIG. 2B) may be small compared to the area of the cap region 202a defined by the hollow chamber 204.

According to various embodiments, the hollow chamber 204 and the support structure 208 may be provided via semiconductor processing of an initial wafer using at least a lithographic process for patterning the wafer and therefore, the size and the shape of the edge region 202e may be defined by the limits of the semiconductor processing or the size and the shape of the edge region 202e may be predefined. Further, according to various embodiments, the size and the shape of the edge region 202e may be defined by the respective pattern provided in the wafer 200 for forming the hollow chamber 204 via an annealing (cf. FIGS. 3A and 3B).

According to various embodiments, the diameter 200w of the wafer 200 may be in the range from about 150 mm to about 450 mm, wherein the method 100 may not be limited by the diameter 200w of the wafer 200. Accordingly, the diameter 207 of the hollow chamber 204 may be in the range from 149 mm to about 449 mm. According to various embodiments, the area of the edge region 202e (e.g. the surface area of the edge region 202e) may be in the range from about 0.01% to about 20% of the area of the surface 202s of the wafer 200. According to various embodiments, the area of the edge region 202b (e.g. the surface area or the area projected on the surface 202s of the wafer 200) may be in the range from about 0.1% to about 10% of the area of the surface 202s of the wafer 200.

According to various embodiments, the area of the cap region 202a (e.g. the surface area of the cap region 202a) may be greater than the area of the edge region 202e (e.g. the surface area of the edge region 202e), e.g. the area ratio (cap region area/edge region area) may be greater than 3, or e.g. greater than 4, or e.g. greater than 5, or e.g. greater than 6, or e.g. greater than 7, or e.g. greater than 8, or e.g. greater than 9, or e.g. greater than 10, or e.g. greater than 20, or e.g. greater than 50, or e.g. greater than 100, or e.g. greater than 200, or e.g. greater than 500. In other words, the area of the cap region 202a may be as large as possible and the area of the edge region 202e may be as small as possible (e.g. limited by the processing of the hollow chamber 204 and the support structure 208). The area of the cap region 202a and area of the edge region 202e may be for example measured with respect to the geometric plane spanned by the directions 201, 203.

According to various embodiments, it may be possible to provide more than one hollow chamber 204 within the wafer 200 and an respective support structure 208 without changing the functionality of the support structure 208, wherein the support structure 208 may both support the cap region 202a and break easily such that the cap region 202a can be removed from the rest of the wafer 200.

FIG. 2C shows an SEM-image of a wafer 200 in a perspective (tilted) view after the hollow chamber 204 and the support structure 208 have been formed, according to various embodiments. In this case, the support structure 208 includes a plurality of support structure elements 208 being arranged for example regularly in an array with a pitch of about 50 µm. However, the pitch may also be less or greater than 50 µm, e.g. in the range from about 10 µm to about 50 µm, e.g. in the range from about 50 µm to about 100 µm, and the plurality of support structure elements 208 may also be arranged in another (e.g. irregular, e.g. hexagonal) arrangement.

FIG. 2D shows a cross sectional SEM-image (related to FIG. 2C) of a wafer 200 in a cross sectional view (e.g. a cut through a single pile 208) after the hollow chamber 204 and the support structure 208 (the piles) have been formed, according to various embodiments. According to various embodiments, the support structure 208 may have a width 208w in the range from about 0.5 µm to about 10 µm, e.g. in the range from about 1 µm to about 10 µm, e.g. in the range from about 2 µm to about 5 µm. According to various embodiments, the support structure 208 may have a height which may be substantially equal to the height 204h of the hollow chamber 204, e.g. in the range from about 0.5 µm to about 10 µm, e.g. in the range from about 0.5 µm to about 5 µm, e.g. in the range from about 1 µm to about 5 µm. According to various embodiments, the cap region 202a may have a height (a thickness) in the range from about 0.5 µm to about 20 µm, e.g. in the range from about 0.5 µm to about 10 µm, e.g. in the range from about 1 µm to about 5 µm. Further, the height (a thickness) of the cap region 202a may be increased by performing a layering process, e.g. by forming an epitaxial silicon layer over the cap region 202a.

FIG. 2E and FIG. 2F respectively show a schematic cross sectional view or side view of a wafer 200 during removing the cap region 202a. According to various embodiments, the entire cap region 202a may be rolled up by utilizing a roller

200r. For removing the cap region 202a, the cap region 202a may be firstly separated from the edge region 202e, e.g. by forming a vertical trench surrounding (partially or completely) the cap region 202a, the vertical trench extending from the surface 202s of the wafer 200 to the hollow chamber 204.

According to various embodiments, removing the cap region may include firstly bringing a roller 200r into contact with the cap region 202a of the wafer 200, as shown in FIG. 2E, and secondly rolling 201r the roller 200r over the wafer 200 such that the cap region 202 is adhered to the roller 200r and removed from the bottom region 202b (or from the wafer 200), as shown in FIG. 2F. According to various embodiments, the roller may include an adhesive surface or the roller may be covered with an adhesive tape, e.g. a wafer tape. Further, according to various embodiments, the wafer tape and the cap region 202a may be removed from the roller 200r for further processing the cap region 202a as ultra-thin wafer.

According to various embodiments, the support structure elements 208 supporting the cap region 202a may not break at the same time, due to utilizing a roller 200r for removing the cap region 202a from the wafer 200, which may allow removing the cap region 202a in one piece without damaging the thin cap region 202a.

Alternatively, the cap region 202a may be removed by using another tool, e.g. a stamp or a plate being covered with an wafer tape or an adhesive tape, according to various embodiments.

FIG. 2G shows a cap region 202a being adhered to a roller 200r after the cap region 202a has been removed from the rest of the wafer 200, according to various embodiments. The thin film 202a (e.g. with a thickness of about 30 microns) has been lifted off from the wafer substrate 200.

The surface area of the removed cap region 202a (which may be the new processing area provided by the cap region 202a as thin or ultra-thin carrier or wafer) may be substantially as large as the surface area of the initial wafer 200 from which the cap region 202a has been formed, e.g. surface area of the removed cap region 202a may be greater than 80% of the surface area of the wafer 200, or e.g. surface area of the removed cap region 202a may be greater than 90% of the surface area of the wafer 200, or e.g. surface area of the removed cap region 202a may be greater than 95% of the surface area of the wafer 200, or e.g. surface area of the removed cap region 202a may be greater than 99% of the surface area of the wafer 200.

As illustrated in FIG. 2A, FIG. 2D, and FIG. 2E in a side view or cross sectional view, according to various embodiments, a plurality of support structure elements 208 (e.g. a plurality of pillars 208) may be disposed or formed in the hollow chamber 204 of the wafer 200. The hollow chamber 204 and the plurality of support structure elements 208 within the hollow chamber 204 may provide a SON-structure 202a or an SOI-structure 202a. According to various embodiments, a plurality of support structure elements 208 may be arranged within the hollow chamber 204, e.g. each being laterally free of material (e.g. solid material, e.g. material of the wafer, e.g. silicon) due to being arranged within the hollow chamber 204.

According to various embodiments, the plurality of support structure elements 208 being arranged within the hollow chamber 204 may be regarded as a support structure or support structure arrangement for stabilizing the cap region 202a of the wafer 200 extending over the support structure elements 208. The support structure elements 208 and the hollow chamber 204 may include silicon or may consist of silicon.

As illustrated in FIG. 2B, the cap region 202a may have a circular shape. The support structure elements 208 may be arranged in the hollow chamber 204 extending respectively from the edge region 202b of the wafer 200 to the cap region 202a of the wafer 200. The lateral distance between respectively two adjacent support structure elements 208 (in other words, nearest-neighbor distance) may be in the range from about several tens of micrometers to about several hundreds of micrometers. Illustratively, the distance between the support structure elements 208 may influence the mechanical stability of the cap region 202a of the wafer 200, such that the distance between the support structure elements 208 may be adapted to the desired needs, e.g. depending on the respective method for forming the at least one hollow chamber 204.

According to various embodiments, during a thermal treatment of the wafer 200 (e.g. during process 110 of method 100), e.g. including heating (at least a part of) the wafer 200 to temperatures in the range from about 500° C. to about 1400° C., the wafer material, e.g. silicon, may start to migrate and/or diffuse, and the cap region 202a of the wafer 200 may for example lose its mechanical stability which could lead to a collapsing of the hollow chamber 204. Referring to this, the support structure elements 208 may provide a mechanical support such that a hollow chamber 204 with a large lateral extension, e.g. up to several tens of centimeters, may be provided within the wafer 200.

According to various embodiments, instead of forming a single buried hollow chamber 204 laterally extending of the large part of the wafer 200, the support structure elements 208 may be provided by forming a plurality of hollow chambers 204 (an array of hollow chambers) within the wafer 200, wherein the material between respectively adjacent hollow chambers of the plurality of hollow chambers 204 remains during the annealing process as support structure elements 208.

Figure 3A:
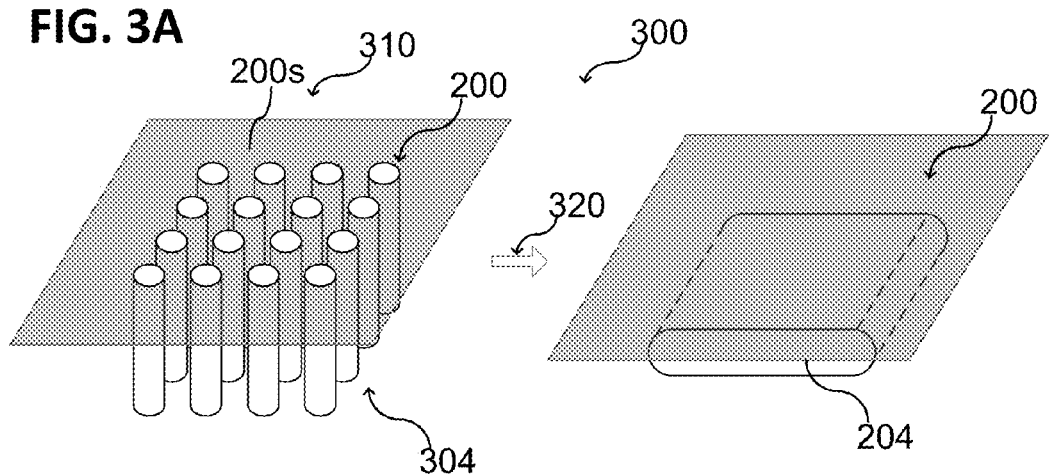
FIG. 3A shows a schematic view of a wafer during processing, according to various embodiments.

According to various embodiments, in the following FIGS. 3A to 3D details may be provided and/or illustrated for a process 300 of forming a hollow chamber 204 in the wafer 200. This process 300 may be used to form a hollow chamber 204 in the wafer 200 separating the cap region 202a from the wafer 200 (e.g. separating a first region 202a from a second region 202b of the wafer 200). FIG. 3A shows a schematic view of a wafer 200 during processing, wherein, in a process 310, an opening structure 304 is provided in the wafer 200, e.g. a plurality or an array of cylindrical holes extending (e.g. vertically) from the surface 202s of the wafer 200 into the wafer 200, according to various embodiments. The spacing between the cylindrical holes and the size (e.g. the diameter and the depth) may be provide such that after an annealing 320 a hollow chamber 204 is provided within the wafer 200. This process 300 may be adapted such that additionally a support structure 208 remains within a hollow chamber 204 or between adjacent hollow chambers 204, e.g. as described for example with reference to FIG. 4A.

Figure 3B:
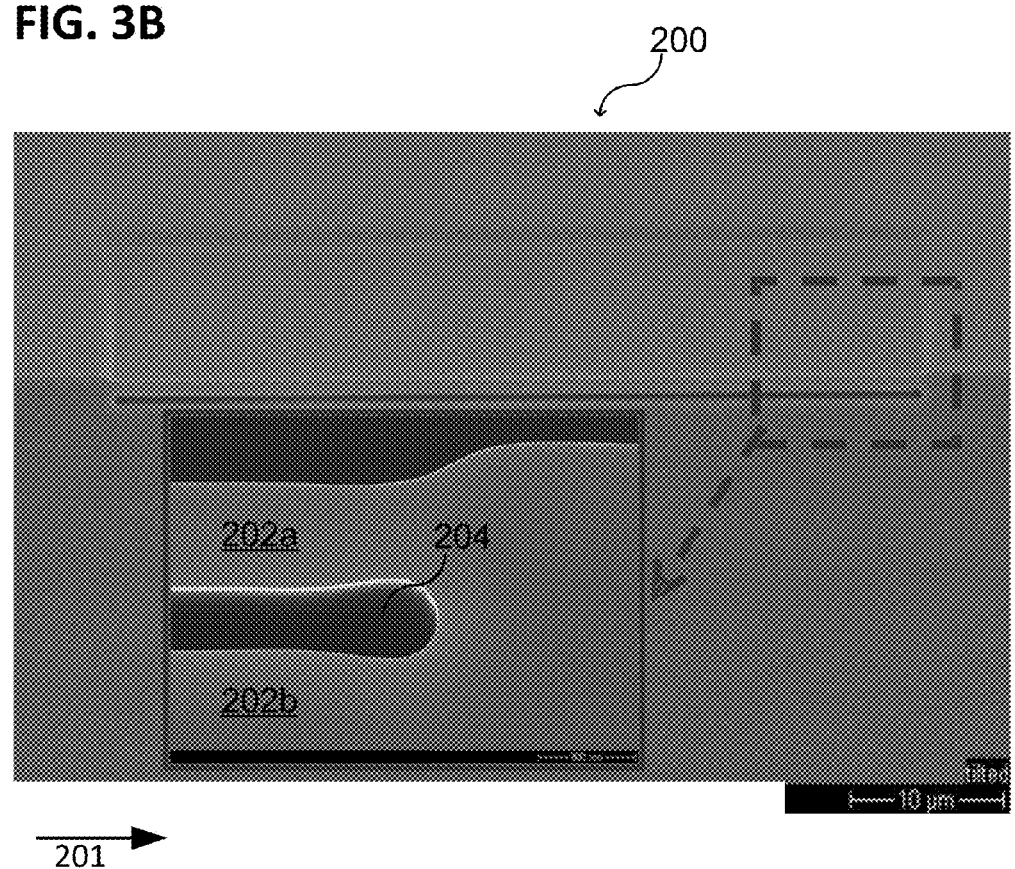
FIG. 3B shows a scanning electron microscopy image (SEM-image) of a wafer during processing, according to various embodiments.

FIG. 3B shows a scanning electron microscopy image (SEM-image) of a wafer 200 after the annealing 320 has been carried out, according to various embodiments. The hollow chamber 204 formed in the wafer 200 may be covered by a cap layer 202a, as already described. The cap layer 202a may include the same material as the wafer 200 or the cap layer 202a may include the same material as the surface layer 202 surrounding the hollow chamber 204, e.g. the cap layer 202a may include silicon. As illustrated in FIG. 3B, the hollow chamber 204 may extend laterally in the wafer 200 (along the directions 201, 203), wherein the hollow chamber 204 may have a lateral extension in the range from about 40 µm to about 60 µm (e.g. in both lateral spatial directions 201, 203).

Further, the thickness of the cap layer 202a may be in the range from about 1 μm to about 10 μm after the annealing. According to various embodiments, an epitaxial layer, e.g. an epitaxial silicon layer, may be formed over the cap layer 202a covering the hollow chamber 204.

Figure 3C:
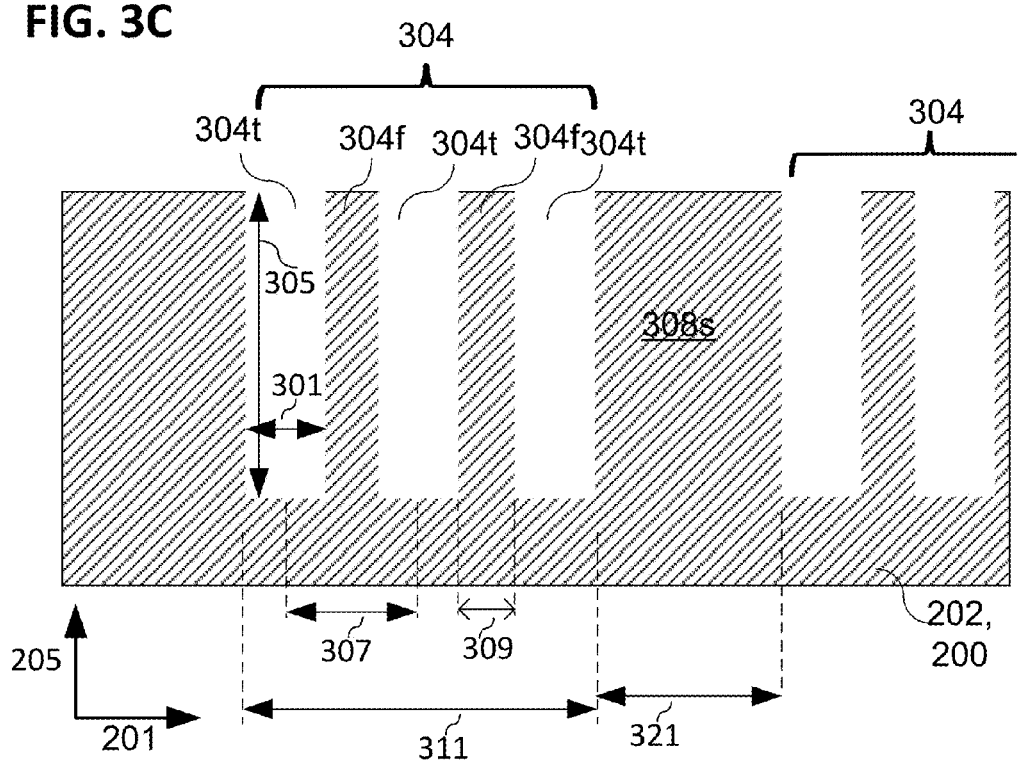
FIGS. 3C and 3D respectively show a schematic cross sectional view or side view of a wafer during processing, according to various embodiments.
Figure 3D:
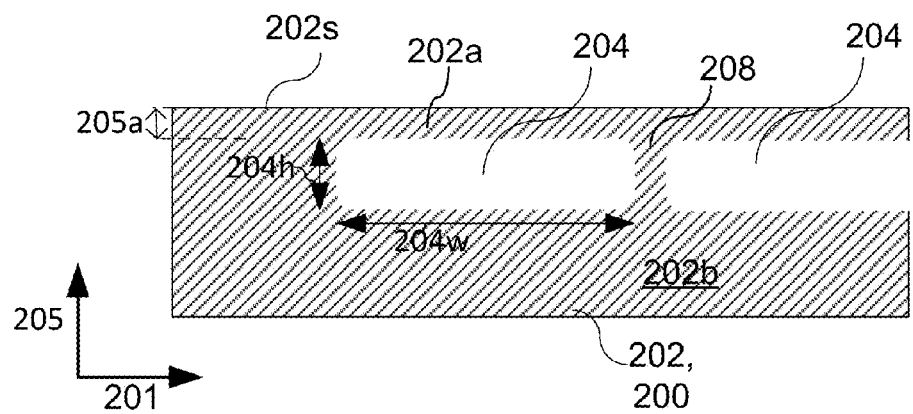

FIG. 3C shows a schematic cross sectional view or side view of a wafer 200 during processing, e.g. after an opening structure 304 has been formed in the wafer 200, e.g. via a patterning process. FIG. 3D shows a schematic cross sectional view or side view of a wafer 200 during processing, e.g. after an annealing of the opening structure 304, illustrated in FIG. 3C, has been carried out.

As illustrated in FIG. 3C and FIG. 3D, forming the hollow chamber 204 within the wafer 200 may include: forming an opening structure 304 in the wafer 200, the opening structure 304 may include one or more openings 304t (trenches, holes), each of the one or more openings 304t extending from the surface 202s of the wafer 200; and performing an anneal process such that the hollow chamber 204 is formed in the wafer 200 from the opening structure 304. For providing the support structure 208 supporting the cap layer 202a after the annealing has been carried out, a plurality of opening structures 304 may be arranged in the wafer 200, wherein the distance 321 between adjacent opening structures 304 may be provided greater than the distance 309 between the openings 304t of the opening structure 304. In other words, the wafer 200 may be patterned such that the wafer 200 may include one or more of the opening structures 304, as illustrated for example in FIG. 4A, wherein the one or more of the opening structures 304 may laterally surround or at least partially laterally surround the support structure 208 or one or more support structures 208. The support structure 208 may be a support region 308s provided in the wafer 200 with such a size and shape that the support region 308s remains during the annealing. Illustratively, the patterning of the wafer 200 may be carried out in such a way, that a part 308s of the wafer 200 remains after the annealing as support structure 208 and that another part 304 of the wafer 200 is transformed during the annealing into at least one hollow chamber 204. Therefore, according to various embodiments, the hollow chamber 204 formed from the one or more opening structures 304 may laterally surround the support structure 208 after the annealing has been carried out.

According to various embodiments, a method for processing a wafer 200 may include: forming at least one opening structure 304 at least one of over or in a first region 202 of the wafer 200 (e.g. in a surface layer of the wafer 200 including silicon); and subsequently annealing the at least one opening structure 304 such that at least one hollow chamber 204 (one or more hollow chambers 204) may be formed by material of the at least one opening structure 304 (such a processing of the wafer may be also referred to as venetia process). According to various embodiments, a plurality of hollow chambers 204 may be formed in the wafer 200 providing a plurality of cap regions forming a cap layer 202a, the cap layer 202a (or the plurality of cap regions) being separated from the rest 202b of the wafer 200 below the hollow chambers 204. The cap regions 202a may be connected with the rest 202b of the wafer 200 via the support structure 208 after the annealing process has been carried out.

According to various embodiments, the support structure 208 may be arranged within a continuous single hollow chamber 204, the support structure 208 carrying the cap region 202a over the continuous single hollow chamber 204. Alternatively, the support structure 208 may be arranged within one or more hollow chambers 204 of a plurality of hollow chambers 204 and/or between adjacent hollow chambers 204 of a plurality of hollow chambers 204, the support structure 208 carrying the cap region 202a over the plurality of hollow chambers 204. According to various embodiments, the continuous single hollow chamber 204 or the plurality of hollow chambers 204 may have a large lateral extension, e.g. geometrically projected on the surface 202s of the wafer 200 the continuous single hollow chamber 204 or the plurality of hollow chambers 204 may be greater than 80% of the surface area of the wafer 200 such that the cap layer 202a can be removed from the rest 202b of the wafer 200 via breaking the support structure 208 remaining between the cap region 202a and the rest 202b of the wafer 200 for supporting the cap region 202a. In other words, the continuous single hollow chamber 204 or the plurality of hollow chambers 204 may form a predefined breaking region in the wafer 200 such that the cap region 202a can be removed. The removed cap region 202a may provide a new thin or ultra-thin wafer 202a or carrier 202a, wherein the area (surface area or lateral extension) of the removed cap region 202a may be greater than 80% (or e.g. 90% or e.g. 95%) of the area (surface area or lateral extension) of the initial carrier 200 or wafer 200. Illustratively, considering the processing area, only a small edge region of the wafer may get lost during the processing of an ultra-thin wafer 202a or carrier 202a from the initial wafer 200.

As schematically illustrated in FIG. 3C, according to various embodiments, the opening structure 304 may include one or more openings 304t (e.g. recesses or holes) formed in the wafer 200 or in a surface layer 202 of a wafer 200. According to various embodiments, the opening structure 304 may be formed by patterning a previously deposited surface layer 202 and/or by forming one or more structure elements 304f at least one of over or in the wafer 200.

The wafer 200 may be a silicon wafer 200 or a silicon substrate 200, as already described. The wafer 200 may be an arbitrary type of carrier, as already described, including a carrier surface layer 202, wherein the carrier surface layer 202 may be a silicon layer 202. The process of forming the opening structure 304 in a wafer 200, as described herein, may be applied in analogy to a wafer 200 having a silicon surface 202 layer.

A process for forming at least one opening structure 304 at least one of over or in the wafer 200 may include patterning the wafer 200 (or patterning the surface layer 202 of a carrier). Therefore, a patterned mask layer may be disposed over the wafer 200, wherein the patterned mask layer may at least partially cover the wafer 200 and may expose regions of the wafer 200 to be etched, and subsequently wafer material may be partially removed from the at least one exposed region of the wafer 200 to form at least one opening structure 304 in the wafer 200.

According to various embodiments, the shape, the size, the position, and the number of openings 304t included in the opening structure 304 may be selected in accordance with the desired shape of the hollow chamber 204 to be formed in the wafer 200. The shape, the size, the position, and the number of opening structures 304 may be selected in accordance with the desired shape, size, position, and number of hollow chambers 204 to be formed in the wafer 200.

According to various embodiments, at least one etch process may be applied to partially remove the respective wafer material to provide the at least one opening structure 304, wherein the least one etch process may include a dry etch process, e.g. reactive ion etching, e.g. deep reactive ion etching. A reactive etch process, as described herein, may include at least one of the following etch chemistries: $SF_6$, $O_2$, HBr, $NF_3$, $C_4F_8$, and $C_4F_6$. The etch process may be selective to the wafer material, e.g. selective to silicon, such that a patterned mask layer may be utilized to remove the wafer material partially at the desired positions, and therefore, forming at least one opening structure 304 at the desired position. The openings 304t of the opening structure 304 may be surrounded by wafer material 200, 202, 304f (e.g. by silicon). The openings 304t included in the at least one opening structure 304 may have an aspect ratio (the ratio of the depth 305 of the opening 304t to the width 301 of the opening 304t), in the range from about 2 to about 30, e.g. in the range from about 2 to about 20, e.g. in the range from about 2 to about 10.

The plurality of openings 304t, as shown for example in FIG. 3C, may represent the opening structure 304. Each opening 304t of the plurality of openings may have a rectangular shape or a quadratic shape in the cross sectional view, as illustrated in FIG. 3C. The base area of the openings 304t included in the at least one opening structure 304, e.g. seen from the top, may have the shape as defined by a the utilized patterned mask layer, e.g. a rectangular shape, a quadratic shape, a polygonal shape, a circular shape or an elliptic shape. The openings 304t may have the form (or shape) of a right prism, e.g. a cube, a cuboid, a cylinder, and the like.

As shown in the cross sectional view in FIG. 3C, at least one opening 304t of the plurality of openings 304t, e.g. all openings of the plurality of openings 304t, may have a depth 305 in the range from about 1 μm to about 100 μm, e.g. in the range from about 1 μm to about 50 μm. According to various embodiments, at least one opening 304t of the plurality of openings 304t, e.g. all openings of the plurality of openings 304t, may have a width 301 (or in the case of cylindrical shapes a diameter 301) in the range from about 0.1 μm to about 50 μm, e.g. in the range from about 0.2 μm to about 20 μm, e.g. in the range from about 0.5 μm to about 5 μm. According to various embodiments, the distance 307 between two adjacent openings 304t of the opening structure 304, measured from the center of one of the two adjacent openings to the center of the other one of the two adjacent openings, may be in the range from about 0.2 μm to about 100 μm. Therefore, according to various embodiments, the width 309 of the remaining wafer material 304f between respectively two adjacent openings 304t of the opening structure 304t may be, as a result of the width 301 and the distance 307, in the range from about 0.1 μm to about 100 μm.

According to various embodiments, the depth 305 of an opening 304t of the opening structure 304 may define or may influence the depth position (e.g. the depth 205a) of the respective hollow chamber 204 (and therefore the thickness 205a of the cap region 202a) formed from the opening structure 304, e.g. in a subsequently performed annealing process or heat treatment (c.f. FIG. 3D). The aspect ratio of an opening 304t of the opening structure 304 may define or may influence the size of the respective hollow chamber 204 formed from the openings 304t, e.g. in a subsequently performed annealing process. In summary, the arrangement of the one or more openings 304t in the opening structure 304 (or the arrangement of more than one opening structures 304 in the wafer 200) may determine and/or influence the arrangement of the one or more hollow chambers 204 generated in the wafer 200, e.g. the at least one hollow chamber 204 may be formed from the opening structure 304 during a subsequently performed annealing process. According to various embodiments, the width 204w of the hollow chamber 204 may be defined by the width 311 of the opening structure 304.

According to various embodiments, the at least one opening structure 304 may include one opening or more than one opening 304t, e.g. any other number of openings, e.g. two, three, four, five, six, seven, eight, nine, ten, or even more than ten, or more than 20 or even more than hundreds of openings 304t, more than thousands of openings 304t, more than millions of openings 304t, depending on the desired number, shape and/or size of hollow chambers 204 to be formed. As illustrated in FIG. 2B (except of a small edge region 202e) substantially the whole processing surface of the wafer 200 (e.g. 80% or 90% or 95% of the wafer surface) may be patterned in such a way that the generated hollow chamber 204 hollows out substantially the whole wafer 200 laterally and such that the cap region 202a extending over the generated hollow chamber 204 may be supported by a large number (e.g. thousands or millions) of support structure elements having respectively a small lateral cross section (e.g. in the range from about 1 μm² to about 20 μm²) such that the support structure elements 208 can easily break for removing the cap region 202a.

An annealing process may be carried out after the opening structure 304 has been formed. As illustrated in FIG. 3D, at least one (one or more) hollow chamber 204 may be formed during the annealing of the opening structure 304, e.g. due to the migration of material of the at least one opening structure 304, e.g. due to the migration of silicon 304f surrounding the openings 304t. The migration of material of the opening structure 304 may form one or more hollow chambers 204 in the wafer 200 separating a cap region 102a from the rest 202b of the wafer 200. According to various embodiments, the lateral extension 204w of a single hollow chamber 204 without being supported by a support structure may be in a range from about several hundreds of nanometers up to several micrometers or even up to several hundreds of micrometers.

According to various embodiments, the material 308s between two opening structures or within an opening structure, undergoes another process during the annealing, e.g. the material 308s may not migrate or diffuse to a hollow chamber, such that the material 308s may provide a support structure 208 during and after the annealing. Due to the support structures 208, the lateral extension 204w of the hollow chamber 204 may not be limited, the lateral extension 204w of the hollow chamber 204 may be in the range from about 100 μm to about 60 cm (e.g. only limited by the lateral extension of the carrier or the diameter of the wafer, e.g. 45 cm for an 18-inch-wafer).

According to various embodiments, the thickness 205a of the cap region 202a covering the at least one hollow chamber 204 or the thickness 205a of the material region 202a above the at least one hollow chamber 204 may be in the range from about 0.2 μm to about 100 μm. The cap region 202a covering the at least one hollow chamber 204 may include silicon (e.g. p-type and/or n-type doped silicon). Further, the initially used wafer 200 for providing the one or more opening structures 304 may form a new surface 202s during the annealing of the one or more opening structures 304 due to the migration and/or diffusion of the wafer material.

According to various embodiments, the annealing process being utilized for forming the at least one hollow chamber 204 (one or more hollow chambers 204) from the one or more opening structures 304 may cause at least one of migration, diffusion, material transport, and material rearrangement of the material surrounding the one or more openings 304t included in the opening structure 304 while forming the at least one hollow chamber 204.

According to various embodiments, the annealing process being utilized to form the at least one hollow chamber 204 from the one or more opening structures 304 may be performed using temperatures in the range from about 800° C. to about 1400° C., e.g. in the range from about 900° C. to about 1300° C., e.g. in the range from about 1100° C. to about 1200°

C. According to various embodiments, the duration of the annealing process may be at least in the range from about several minutes, e.g. greater than 5 min, e.g. greater than 10 min, e.g. greater than 20 min According to various embodiments, the annealing process may be carried out under vacuum conditions. According to various embodiments, the annealing process may be carried out in the absence of a significant oxygen amount (or oxygen partial pressure), e.g. in nitrogen atmosphere, e.g. in an argon atmosphere, e.g. in a chemical reducing atmosphere including nitrogen and hydrogen (e.g. a mixture of nitrogen with 2% to 20% hydrogen (substance amount fraction)), e.g. in a chemically reducing atmosphere including argon and hydrogen (e.g. a mixture of argon with 2% to 20% hydrogen (substance amount fraction)).

According to various embodiments, the at least one hollow chamber 204 may also be referred to as empty space in silicon and the cap region 202a over the at least one hollow chamber 204 may be referred to as silicon on nothing (SON) structure or migrated silicon region. Illustratively, since the empty space 204 may be electrically isolating, the cap region 202a over a hollow chamber 204 may be referred to as silicon on insulator (SOI) structure. The migrated silicon region 202a may have a first thickness after the annealing process, wherein additional material may be deposited over the annealed wafer increasing the thickness of the migrated silicon region 202a.

According to various embodiments, the size and/or the shape of the at least one hollow chamber 204, the thickness of the migrated silicon region 202a, and the position of the at least one hollow chamber 204 may be controlled and/or influenced by the design of the opening structure 304, and therefore, by patterning the wafer 200, which may be performed using processes of semiconductor industry, as described herein. The at least one hollow chamber 204 may be surrounded by silicon, e.g. completely surrounded by silicon. In other words, the at least one hollow chamber 204 may not have an opening to a surface of the wafer 200 after being formed via the annealing process.

According to various embodiments, the size, the shape, and the position of the at least one hollow chamber 204 may not significantly change or vary in a further heat treatment. According to various embodiments, the at least one hollow chamber 204 may be stable in size, shape, and/or position up to temperatures of about 1300° C. According to various embodiments, the at least one hollow chamber 204 may provide a stable electrically insulating structure 204 in the wafer 200, wherein the wafer 200 may be processed at high temperatures, as for example typical high temperature processes included in manufacturing an integrated circuit, e.g. in manufacturing a CMOS-structure, e.g. in manufacturing a power semiconductor device, e.g. in manufacturing a transistor, e.g. in manufacturing a photo sensor, and for example in manufacturing a micro electromechanical system (cf. FIGS. 6B and 7B).

FIG. 4A illustrates a wafer 200 in a top view during processing, e.g. at a processing stage after the opening structure 304 is provided in the wafer 200 and before the annealing is carried out. FIG. 4B illustrates a patterning layout for forming the opening structure 304 in the wafer 200. As already described, the opening structure 304 may include a plurality of openings 304t extending from the surface 202s of the wafer 200 into the wafer 200. Further, according to various embodiments, the opening structure 304 may include support regions 308s, e.g. one or more regions being free of openings 304t. During annealing the wafer 200 the plurality of openings 304t may form a hollow chamber 204 and a cap region 202a over the hollow chamber 204, the cap region 202a supported or carried by the support structure 208 formed from or provided by the support regions 308s.

According to various embodiments, the patterned wafer 200 may include an opening structure 304, wherein the opening structure 304 includes an array of openings 304t, e.g. as illustrated in FIG. 4A and FIG. 4B. The support regions 308s may not be patterned or may be free of openings 304t. The pitch 201p, 203p of the support regions 308s may be in the range from about 10 μm to about 100 μm, e.g. in the range from about 40 μm to about 60 μm. The array defined by the support regions 308s as corners of the array may include a plurality of openings 304t, e.g. more than 100, or more than 1000, or a number of openings 304t in the array may be in the range from about 100 to about 10000.

According to various embodiments, each support structure element 208 provided by the support region 308s may carry a part of the cap region 202a with an area in the range from about 100 $\mu m^2$ to about 10000 $\mu m^2$, e.g. in the range from about 1500 $\mu m^2$ to about 4000 $\mu m^2$. In other words, a hollow space 204 may be provided defined by the support structure elements 208 as limit points, wherein the hollow space 204 may laterally undermine a part of the cap region 202a with an area in the range from about 100 $\mu m^2$ to about 10000 $\mu m^2$, e.g. in the range from about 1500 $\mu m^2$ to about 4000 $\mu m^2$.

As illustrated in FIG. 4B, four etch holes may be omitted every 50 μm (e.g. in the corners of a 50 μm square) in the mask layout. According to various embodiments, the mask layout may define the etch hole positions used to generate supporting structure 208 and the hollow chamber 204.

FIG. 5 shows a schematic flow diagram of a method 500 for forming the at least one hollow chamber 204 and the support structure 208 within the wafer 200, as described before. According to various embodiments, the method 500 for forming the at least one hollow chamber 204 and the support structure 208 within the wafer 200 may include: in 510, forming at least one opening structure 304 in the wafer 200 and providing support regions 308s within the at least one opening structure 304, and, in 520, performing an anneal process to form the at least one hollow chamber 204 and the cap region 202a from the at least one opening structure 304 and to form the support structure 208 supporting the cap region 202a from the support regions 308s. Thereby, the wafer 200 may include silicon and the anneal process may be performed at a temperature of at least about 900° C.

Alternatively, FIG. 6 shows a schematic flow diagram of a method 600 for forming the at least one hollow chamber 204 and the support structure 208 within the wafer 200, the method 600 may include: in 610, forming at least one porous structure in the wafer 200 and providing support regions 308s within the porous structure, and, in 620, performing an anneal process to form the at least one hollow chamber 204 and the cap region 202a from the at least one porous structure and to form the support structure 208 supporting the cap region 202a from the support regions 308s.

Figure 7A:
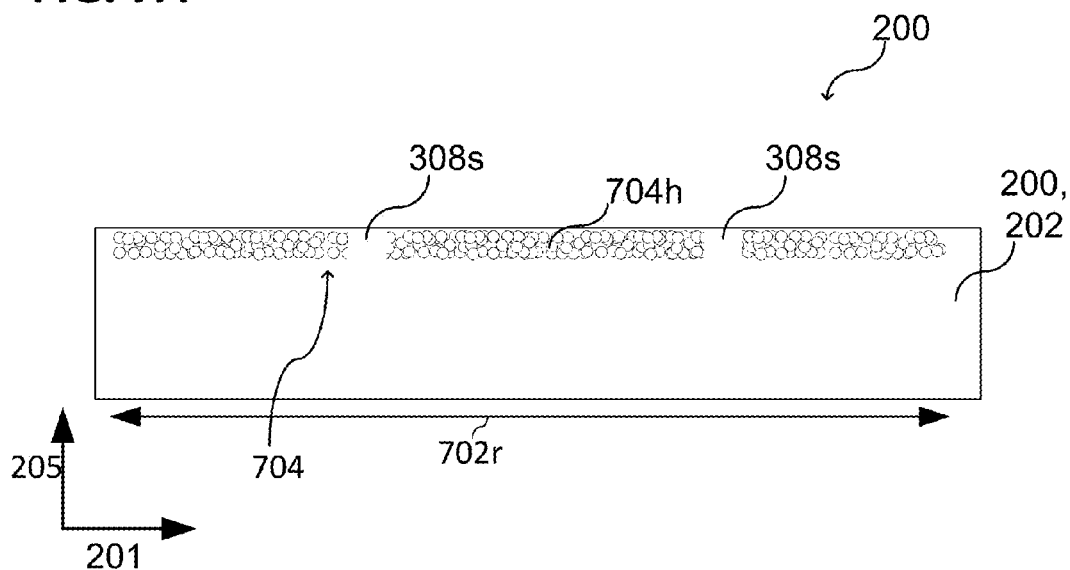
FIGS. 7A to 7C respectively show a schematic cross sectional view or side view of a wafer at different stages during processing, according to various embodiments.
Figure 7B:
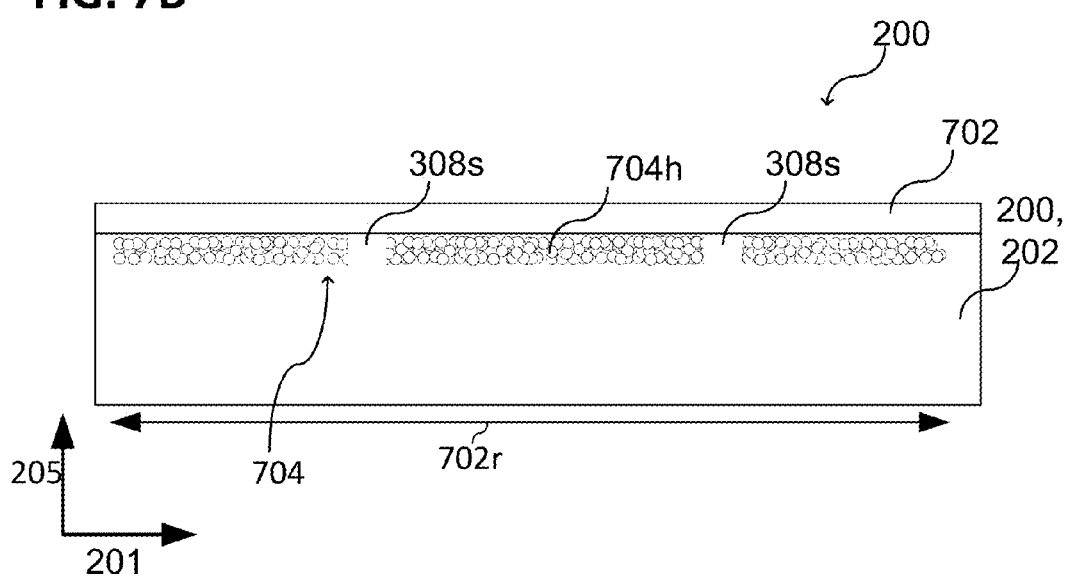
Figure 7C:
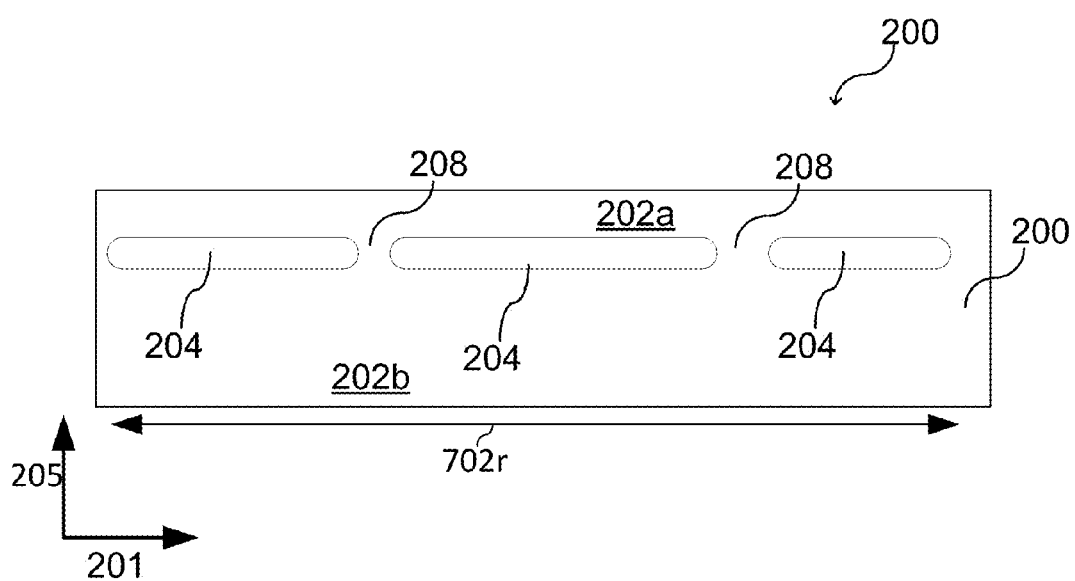

According to various embodiments, as illustrated in FIGS. 7A to 7C, forming a hollow chamber 204 in the wafer 200 may include: forming a porous structure 704 at least one of over or in the wafer 200, the porous structure 704 including a plurality of pores 704h in the wafer material 202 of the wafer 200; and forming a cover layer 702 over the wafer 200, the cover layer 702 covering the porous structure 704. According to various embodiments, the porous structure 704 may include one or more porous regions. Illustratively, the opening structure 304, as described before, may include one or more porous regions 704. Further, the hollow chamber 204 may be formed from the porous structure 704 covered with the cover layer 702 by performing an anneal process, such that the plurality of pores 704h may form a continuous hollow chamber 204, as described before.

According to various embodiments, FIG. 7A shows a wafer 200 after a porous structure 704 has been formed in the wafer 200, the porous structure 704 may include a plurality of pores 704h (e.g. voids being surrounded by wafer material (e.g. silicon) of the wafer 200). According to various embodiments, the porous structure 704 may be formed by processing a selected region 702r of the wafer 200, wherein the wafer 200 may be for example a silicon substrate. The selected region 702r may be defined (or the region 702r of the wafer 200 may be selected) by applying a mask material layer and patterning the mask material layer subsequently, such that a selected region 702r of the wafer 200 may be partially exposed. In other words, a predefined patterned mask layer may be disposed over the cover layer 702.

The selected region 702r may be subsequently subjected to a physical and/or chemical treatment (e.g. a pore formation treatment) to provide a porous structure 704 in a defined region of the wafer 200. As described herein, the term "porosity" or related terms like "porous" structure, and the like, may be defined as the fraction of voids within the material. For example, porous silicon may be divided into three categories based on the size of the pores included in the silicon: firstly, micro-porous silicon including pores having a diameter less than about 2 nm, secondly, meso-porous silicon including pores having a diameter in the range from about 2 nm to about 50 nm, and, thirdly, macro-porous silicon including pores having a diameter greater than about 50 nm.

Therefore, forming a porous structure 704 in a selected region 702r of the wafer 200 may include partially treating a silicon substrate 100 such that at least one porous region is formed in the silicon substrate 100 including at least one of macro-porous silicon, meso-porous silicon, or micro-porous silicon. According to various embodiments, forming a porous structure 704 in a selected region 702r of the wafer 200 may include introducing a plurality of pores 704h into the silicon substrate 100, the plurality of pores 704h forming the porous structure 704 in a selected region 702r of the wafer 200, e.g. by using an anodization process (e.g. performed in an anodization cell). An anodization cell may for example include a platinum cathode and a silicon wafer 200 being configured as anode in presence of an electrolyte, e.g. hydrogen fluoride ($HF_{aq}$) electrolyte. Thereby, the corrosion of the silicon substrate may be generated by applying a voltage between the platinum cathode and the silicon substrate and running electrical current through the anodization cell.

According to various embodiments, forming a porous silicon region in the wafer 200 by utilizing an anodization process may enable to generate a porosity of porous silicon in the range from about 5% to about 90%. Further, the electrolyte being used in the anodization cell may include ethanol.

Further, according to various embodiments, forming a porous structure 704 in the selected region 702r of the wafer 200 may include introducing a plurality of pores 704h into the silicon substrate 100 by using stain etching or a so-called stain etch process.

A stain etch process may include performing a wet etch process using a stain-etchant, e.g. at least one of hydrofluoric acid, nitric acid and water, e.g. an etchant including hydrofluoric acid, nitric acid and water (e.g. a diluted solution of nitric acid in concentrated hydrofluoric acid). According to various embodiments, a porous silicon structure 704 may be formed by stain-etching, e.g. by subjecting an exposed region 702r of the silicon substrate 100 to a wet etchant including nitric acid ($HNO_3$) and hydrogen fluoride (HF).

After one or more porous structures 704 have been formed in the wafer 200, as shown in FIG. 7A, a cover layer 702 may be formed over the wafer 200; the cover layer 702 may cover the porous structure 704 completely. According to various embodiments, the cover layer 702 being formed over the surface of the wafer 200 may include silicon, wherein the wafer 200 may include silicon as well, therefore, a buried porous structure 704 may be formed within the wafer 200, as illustrated in FIG. 7B. According to various embodiments, the cover layer 702 may be regarded as providing a part of a surface region 202 of the wafer 200.

According to various embodiments, the porous structure 704 may be formed in the wafer 200, such that the support regions 308s may be provided (e.g. the support regions 308s may be covered by a mask layer during forming the plurality of pores 704h), similarly as described before with reference to for example FIG. 4A. The porous structure 704 may be formed such that the porous structure 704 may laterally surround the support regions 308s.

Subsequently, according to various embodiments, a heat treatment (annealing) may be carried out such that at least one hollow chamber 204 may be formed from the porous structure 704. Illustratively, the material (silicon) of the porous structure 704 may migrate and/or diffuse forming a hollow chamber 204 and the cap region 202a covering the hollow chamber 204 during a heat treatment performed in a hydrogen containing atmosphere. According to various embodiments, the heat treatment (anneal) may include annealing the porous structure 704 at a temperature in the range from about 900° C. to about 1100° C. (c.f. the venetia process). According to various embodiments, the pores 704h of the porous structure 704 may grow together during the thermal treatment, such that a single hollow chamber 204 may be formed, as shown in FIG. 7C. The wafer 200 illustrated in a schematic cross sectional view in FIG. 7C may be further processed as already described, e.g. the cap region 202a may be removed from the wafer 200.

According to various embodiments, the region 702r in the wafer 200 defining the size of the porous structure 704 may be selected by providing different types of doping in the region 702r and in the part of the wafer 200 surrounding the region, since the formation of the porous structure 704 may be influenced by doping the wafer 200.

According to various embodiments, the support structure 208 may be designed to be easily destroyed by applying a mechanical force on the cap region 202a of the wafer 200, e.g. to spatially separate and/or remove the cap region 202a (the SON-structure or the SOI-structure) from the wafer 200.

According to various embodiments, the cap region 202a of the wafer 200 may be removed (spatially removed or detached) from the wafer 200, e.g. after an electronic component has been formed in the cap region 202a of the wafer 200.

Alternatively, the removed cap region 202a of the wafer 200 may be utilized to manufacture an electronic device, e.g. the cap region 202a may provide a carrier or wafer for further processing.

Figure 8:
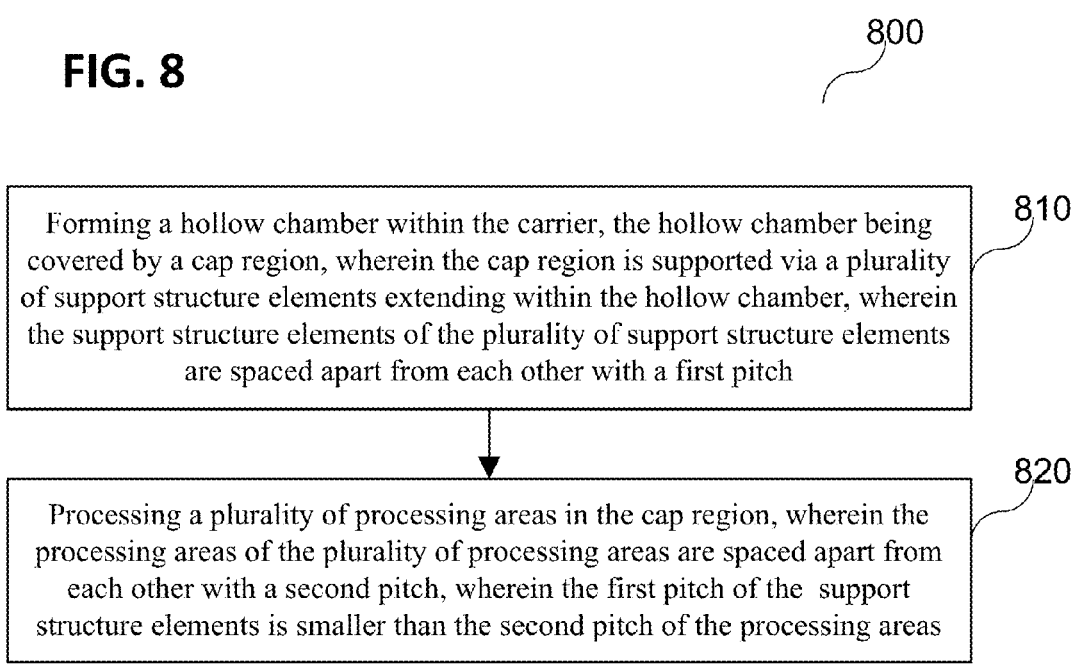
FIG. 8 shows a schematic flow diagram of a method for processing a carrier or a wafer, according to various embodiments.

FIG. 8 shows a schematic flow diagram of a method 800 for processing a carrier 200 or a wafer 200, the method 800 may include: in 810, forming a hollow chamber within the carrier, the hollow chamber being covered by a cap region, wherein the cap region is supported via a plurality of support structure elements extending within the hollow chamber, wherein the support structure elements are spaced apart from each other with a first pitch; and, in 820, processing a plurality of processing areas in the cap region, wherein the processing areas are spaced apart from each other with a second pitch, wherein the first pitch of the support structure elements is less than the second pitch of the processing areas.

According to various embodiments, the pitch may be regarded as (center-to-center distance), e.g. geometrically considered.

As already described, according to various embodiments, the pitch of the support structure elements 208 of the plurality of support structure elements 208 (cf. the pitch 201p, 203p of the support regions) may be in the range from about 10 μm to about 100 μm, e.g. in the range from about 40 μm to about 60 μm. Further, the pitch of the processing areas in the cap region may be for example in the range from about 1 mm to about 50 mm, e.g. in the range from about 1 m to about 30 mm. According to various embodiments, each processing area of the plurality of processing areas laterally overlaps more than one support structure element of the support structure 208.

Further, according to various embodiments, the plurality of processing areas may be defined in the cap region 202a, e.g. before the cap region 202a is removed from the wafer 200, e.g. via forming an alignment structure within the cap region 202a or within the wafer 200. According to various embodiments, the alignment structure may be formed after the at least one hollow chamber 204 has been formed, wherein the alignment of the processing areas may be independently selected or defined of the provided support structure 208 within the hollow chamber 204.

According to various embodiments, the second pitch of the processing areas may be a non-integer multiple of the first pitch of the support structure elements 208. Illustratively, the processing of the cap region 202a may be independently from the provided support structure 208, since the cap region 202a may not define preferred areas for a subsequent processing.

According to various embodiments, a plurality of processing regions (processing areas) of the cap region 202a may be processed, wherein at least a first processing region of the plurality of processing regions and a second processing region of the plurality of processing regions may differ from each other in at least one of size or shape. According to various embodiments, a first electronic circuit structure with a first active area may be provided in the cap region 202a, and a second electronic circuit structure with a second active area may be provided in the cap region 202a (e.g. laterally next to the first active area), wherein the first active area and the second active area may differ from each other in at least one of size or shape.

Figure 9A:
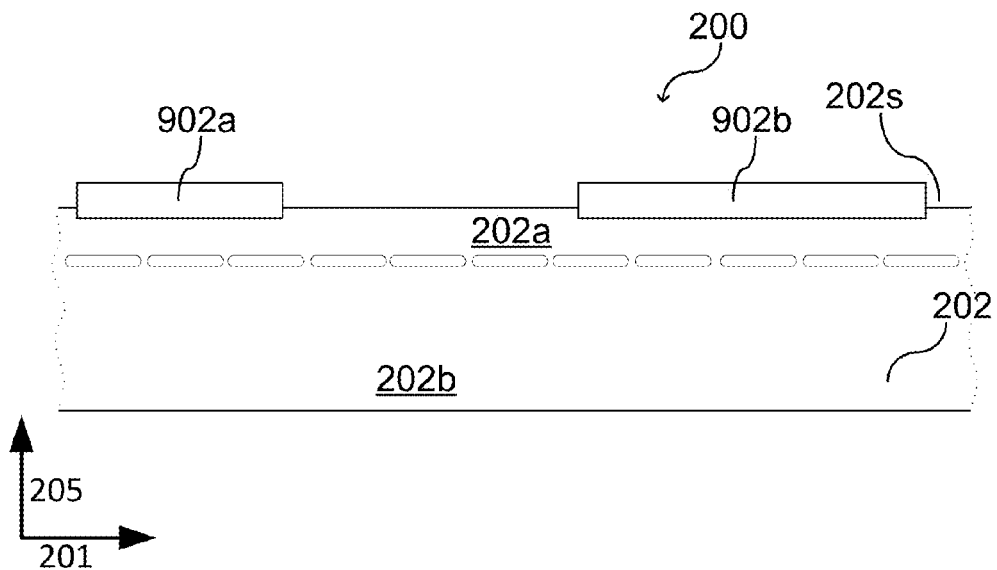
FIGS. 9A and 9B respectively show a carrier or a wafer during processing, according to various embodiments.
Figure 9B:
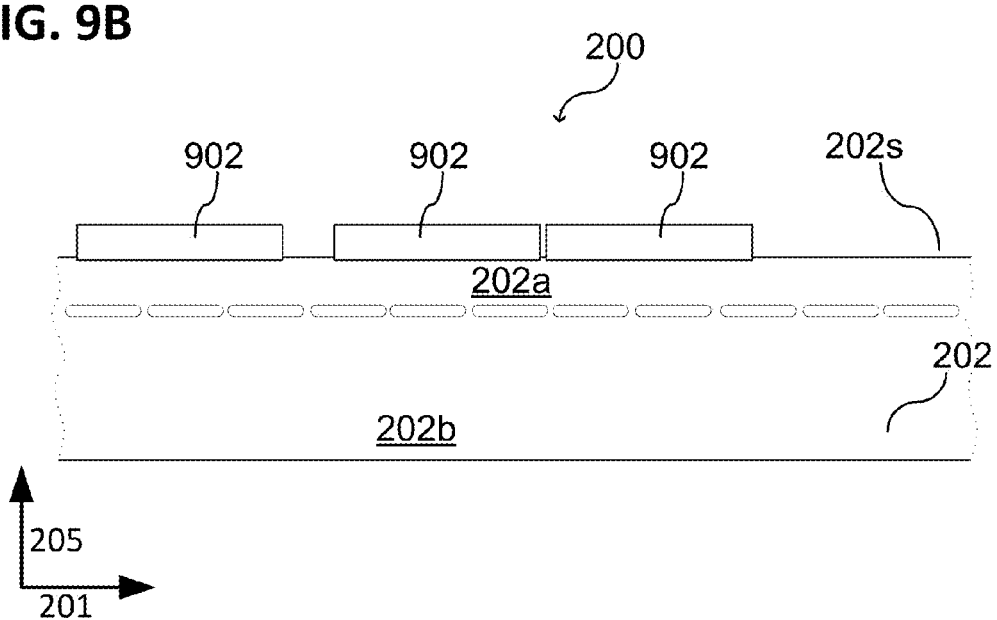

FIG. 9A and FIG. 9B illustrate respectively a wafer 200 during processing, e.g. before the cap region 202a is removed from the wafer 200. According to various embodiments, a plurality of electronic circuit structures (integrated circuits, memory structures, transistor structures, logic circuits, and the like) may be formed in the cap region 202a of the wafer 200. According to various embodiments, the wafer 200 may be subjected to a commonly applied CMOS (Complementary Metal Oxide Semiconductor) processing.

According to various embodiments, a first electronic circuit structure 902a may be formed in a first processing region (area) of the cap region 202a, and a second electronic circuit structure 902b may be formed in the second processing region (area) of the cap region 202a, wherein the first electronic circuit structure 902a (and/or the first processing region) and the second electronic circuit structure 902b (and/or the second processing region) may differ from each other in at least one of size or shape. Illustratively, different electronic circuit structures may need a different space (lateral) on the wafer 200, and the support structure 208 may support the cap region 202a without limiting the processing of the cap region 202a.

According to various embodiments, a plurality of electronic circuit structures 902 may be formed at least one of over or in the cap region 202a, wherein the pitch of the electronic circuit structures 902 of the plurality of electronic circuit structures 902 may be greater than the pitch of the support structure elements of the support structure 208.

Illustratively, each electronic circuit structure 902 of the plurality of electronic circuit structures 902 may be supported by more than one support structure elements of the support structure 208.

According to various embodiments, the electronic circuit structures of the plurality of electronic circuit structures 902 may be laterally separated from each other, e.g. via etching a vertical trench between respectively adjacent electronic circuit structures of the plurality of electronic circuit structures 902 and subsequently, each electronic circuit structure of the plurality of electronic circuit structures 902 may be removed individually from the wafer 200 by cracking the respective plurality of support structure elements supporting the electronic circuit structure 902.

According to various embodiments, all electronic circuit structures of the plurality of electronic circuit structures 902 may be removed from the wafer 200 at the same time via removing the entire cap region 202a, as already described.

Generally, in commonly applied CMOS chip fabrication, the electrically inactive volume part of a silicon wafer may be used for providing mechanical stability during fabrication process of the circuitry. A typical wafer with eight or twelve inch diameter may have a thickness in the range of about one millimeter. After processing, the wafer may be thinned back to a few tens or hundreds micrometers to achieve the form factor desired for example for volume sensitive applications. For power applications with a vertical current flow, a defined and low thickness may be a key target to achieve low resistivity of a switching device. Process scattering may be considered when the wafer is thinned to its final target thickness, and therefore, a portion of resistive losses is due to allowance of a relatively poor control during back thinning of the wafer. In commonly used wafer processing, grinding, polishing and wet etching may be the process of choice to gain a thin wafer thickness before chip separation. Besides the problem of a limited process control, this technique may by difficult to apply when the target thickness is in the range of 60 microns or lower, since losses may occur due to wafer breakage and wafer cracking.

According to various embodiments, one or more closed cavities may be provided within a silicon bulk material, e.g. via a silicon-on-nothing process (Venice process). Using for example a thermal reflow of trench-etched silicon substrates, large square-shaped cavities may be produced, as described for example with reference to FIG. 3A and FIG. 3B.

According to various embodiments, this technique may be utilized to manufacture a micromechanical, optical or sensor device. According to various embodiments, the lamella layer 202a may limit the downforce parameter during a CMP (chemical mechanical polishing) and/or during other standard processes of a standard CMOS flow. According to various embodiments, a lift off of the lamella layer 202a (the cap region 202a) may be performed on wafer level and may meet a layer thickness accuracy in the range of about one micron.

According to various embodiments, a large cavity 204 may be provided with very defined local supporting structures 208 that are structured seamlessly at the whole wafer. In other words, the support structure 208 may not extend trought the cap region 202a.

According to various embodiments, a large cavity 204 may be provided that separates a lamella 202a that is substantially as large as the substrate wafer 200. Further, according to various embodiments, a supporting structure 208 may be provided for silicon-on-nothing configurations. The supporting structure 208 or the silicon-on-nothing configurations may be defined via a layout of the lithography mask for the etching process and a seamless structuring processing of the processing area of the wafer (e.g. a frame 202e (an edge region 202e) may be left at the edge of the wafer 200).

According to various embodiments, other layouts may be suited for forming the at least one hollow chamber 204 and the support structure 208 depending on the focus of application (e.g. the distance of omitted etch holes may be varied or the number of omitted etch holes may be varied).

According to various embodiments, a method for processing a wafer may include: forming at least one hollow chamber and a support structure within the wafer, the at least one hollow chamber defining a cap region of the carrier located above the at least one hollow chamber and a bottom region of the carrier located below the at least one hollow chamber and an edge region surrounding the cap region of the carrier, wherein a surface area of the cap region is greater than a surface area of the edge region, and wherein the cap region is connected to the bottom region by the support structure; removing the cap region in one piece from the bottom region and the edge region.

According to various embodiments, removing the cap region may include rolling up the entire cap region. According to various embodiments, rolling up the cap region or removing the cap region may include: bringing a roller into contact with the cap region, and subsequently rolling the roller over the wafer, wherein the cap region adheres to the roller.

According to various embodiments, forming the at least one hollow chamber and the support structure within the wafer may include: forming at least one opening structure in the wafer and providing a plurality of support regions within the at least one opening structure, performing an anneal process to form the at least one hollow chamber and the cap region from the at least one opening structure and to form the support structure supporting the cap region from the support regions.

According to various embodiments, forming the at least one opening structure may include forming a plurality of openings in the wafer, the openings surrounding the support regions and extending from a surface of the wafer into the wafer.

According to various embodiments, the wafer may include silicon and the anneal process may be performed at a temperature of at least about 900° C.

According to various embodiments, each opening of the plurality of openings is formed to have a width in a range from about 600 nm to about 900 nm.

According to various embodiments, each opening of the plurality of openings is formed to have a depth in a range from about 0.5 μm to about 10 μm.

According to various embodiments, a pitch between two adjacent openings of the plurality of openings may be in a range from about 0.8 μm to about 1.5 μm.

According to various embodiments, forming the at least one hollow chamber and the support structure within the wafer may include: forming at least one porous structure in the wafer and providing a plurality of support regions within the porous structure, performing an anneal process to form the at least one hollow chamber and the cap region from the at least one porous structure and to form the support structure supporting the cap region from the support regions.

According to various embodiments, forming the at least one porous structure may include forming a plurality of porous regions in the wafer, the porous regions surrounding the support regions.

According to various embodiments, the wafer may include silicon and the anneal process for the at least one porous structure may be performed at a temperature of at least about 900° C.

According to various embodiments, forming the support structure may include forming a plurality of support structure elements being arranged spaced apart from each other, the plurality of support structure elements extending within the hollow chamber and supporting the cap region.

According to various embodiments, forming the at least one hollow chamber and the support structure may include forming a plurality of hollow chambers being arranged spaced apart from each other such that a plurality of support structure elements are provided between the hollow chambers, the support structure elements supporting the cap region.

According to various embodiments, forming the support structure may include forming a plurality of support structure elements having a pitch (center to center distance of the next neighbors) in the range from about 10 μm to about 100 μm.

According to various embodiments, forming the support structure may include forming a plurality support structure elements having a cross-sectional area (transverse to the height) of less than about 100 μm$^2$, or e.g. of less than about 25 μm$^2$, or e.g. of less than about 10 μm$^2$, or e.g. of less than about 5 μm$^2$. Thereby, according to various embodiments, the height of the support structure elements may be in the range from about 0.5 μm to about 10 μm.

According to various embodiments, forming the support structure may include forming more than 100 support structure elements supporting a cap region area of about 1 mm$^2$. According to various embodiments, forming the support structure may include forming 250 to 650 support structure elements (or support regions) supporting a cap region area of about 1 mm$^2$.

According to various embodiments, removing the cap region in one piece from the bottom region and the edge region may include: forming a trench structure extending from the surface of the cap region to the hollow chamber, the trench structure laterally surrounding the cap region completely, and removing the cap region in one piece from the bottom region thereby cracking the support structure.

According to various embodiments, removing the cap region in one piece from the bottom region and the edge region may include: forming a trench structure extending from the surface of the cap region to the hollow chamber, the trench structure laterally surrounding the cap region partially such that a connection structure remains connecting the cap region and the edge region; and removing the cap region in one piece from the bottom region and the edge region thereby cracking the support structure and the connection structure.

According to various embodiments, an electronic circuit may be formed at least one of over or in the cap region. According to various embodiments, a plurality of electronic circuits may be formed at least one of over or in the cap region.

According to various embodiments, the method for processing a wafer may further include: processing a plurality of processing regions of the cap region, wherein at least a first processing region of the plurality of processing regions and a second processing region of the plurality of processing regions differ from each other in at least one of size or shape.

According to various embodiments, the method for processing a wafer may further include: forming a first electronic circuit structure with a first active area in the cap region, and forming a second electronic circuit structure with a second active area in the cap region, wherein the first active area of the first electronic circuit structure and the second active area of the second electronic circuit structure may differ from each other in at least one of size or shape.

According to various embodiments, a method for processing a carrier may include: forming a hollow chamber within the carrier, the hollow chamber being covered by a cap region, wherein the cap region is supported via a plurality of support structure elements extending within the hollow chamber, wherein the support structure elements are spaced apart from each other with a first pitch; processing a plurality of processing areas in the cap region, wherein the processing areas are spaced apart from each other with a second pitch, wherein the first pitch of the support structure elements is less than the second pitch of the processing areas.

According to various embodiments, a method for processing a carrier may include: forming a hollow chamber within the carrier, the hollow chamber being covered by a cap region, wherein the cap region is supported via a plurality of support structure elements extending within the hollow chamber, wherein the support structure elements are spaced apart from each other with a first pitch; processing a plurality of processing areas in the cap region, wherein the processing areas are spaced apart from each other with a second pitch, wherein the first pitch of the support structure elements is less than the second pitch of the processing areas.

According to various embodiments, a method for processing a carrier may include: forming a hollow chamber within the carrier, the hollow chamber being covered by a cap region, wherein the cap region is supported via a plurality of support structure elements extending within the hollow chamber, and processing a plurality of processing areas in the cap region, wherein the processing areas differ from each other in at least one of size or shape.

According to various embodiments, the second pitch of the processing areas is a non-integer multiple of the first pitch of the support structure elements.

According to various embodiments, each processing area of the plurality of processing areas laterally overlaps more than one support structure element.

According to various embodiments, a wafer may include: a hollow chamber within the wafer and a support structure extending within the hollow chamber, the hollow chamber being (e.g. completely) covered by a cap region, wherein the cap region is supported by the support structure, and wherein the hollow chamber undermines (or hollows out) more than 80% of a processing surface of the wafer.

According to various embodiments, at least one epitaxial layer may be deposited over the cap region, e.g. before or after the cap region is removed from the wafer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a wafer, the method comprising:
   forming at least one hollow chamber and a support structure within the wafer, the at least one hollow chamber defining a cap region of the wafer located above the at least one hollow chamber and a bottom region of the wafer located below the at least one hollow chamber and an edge region surrounding the cap region of the wafer, wherein a surface area of the cap region is greater than a surface area of the edge region, and wherein the cap region is connected to the bottom region by the support structure;
   removing the cap region in one piece from the bottom region and the edge region.

2. The method according to claim 1, wherein removing the cap region comprises rolling up the entire cap region.

3. The method according to claim 1, wherein removing the cap region comprises:
   bringing a roller into contact with the cap region, and
   subsequently rolling the roller over the wafer, wherein the cap region adheres to the roller.

4. The method according to claim 1, wherein forming the at least one hollow chamber and the support structure within the wafer comprises:
   forming at least one opening structure in the wafer and providing a plurality of support regions within the at least one opening structure,
   performing an anneal process to form the at least one hollow chamber and the cap region from the at least one opening structure and to form the support structure supporting the cap region from the plurality of support regions.

5. The method according to claim 4, wherein forming the at least one opening structure comprises forming a plurality of openings in the wafer, the plurality of openings surrounding the plurality of support regions and extending from a surface of the wafer into the wafer.

6. The method according to claim 4, wherein the wafer comprises silicon and wherein the anneal process is performed at a temperature of at least about 900° C.

7. The method according to claim 1, wherein forming the at least one hollow chamber and the support structure within the wafer comprises:
   forming at least one porous structure in the wafer and providing a plurality of support regions within the porous structure,
   performing an anneal process to form the at least one hollow chamber and the cap region from the at least one porous structure and to form the support structure supporting the cap region from the plurality of support regions.

8. The method according to claim 7, wherein forming the at least one porous structure comprises forming a plurality of porous regions in the wafer, the plurality of porous regions surrounding the plurality of support regions.

9. The method according to claim 7, wherein the wafer comprises silicon and wherein the anneal process is performed at a temperature of at least about 900° C.

10. The method according to claim 1, wherein forming the support structure comprises forming a plurality of support structure elements being arranged spaced apart from each other, the plurality of support structure elements extending within the at least one hollow chamber and supporting the cap region.

11. The method according to claim 1,
wherein forming the at least one hollow chamber and the support structure comprises forming a plurality of hollow chambers being arranged spaced apart from each other such that a plurality of support structure elements are provided between the plurality of hollow chambers, the plurality of support structure elements supporting the cap region.

12. The method according to claim 1,
wherein forming the support structure comprises forming a plurality of support structure elements having a pitch in the range from about 10 µm to about 100 µm.

13. The method according to claim 7,
wherein forming the support structure comprises forming a plurality support structure elements having a cross-sectional area of less than about 100 µm².

14. The method according to claim 1,
wherein forming the support structure comprises forming more than 100 support structure elements supporting a cap region area of about 1 mm².

15. The method according to claim 1,
wherein removing the cap region in one piece from the bottom region and the edge region comprises:
  forming a trench structure extending from the surface of the cap region to the at least one hollow chamber, the trench structure laterally surrounding the cap region completely, and
  removing the cap region in one piece from the bottom region thereby cracking the support structure.

16. The method according to claim 1,
wherein removing the cap region in one piece from the bottom region and the edge region comprises:
  forming a trench structure extending from the surface of the cap region to the at least one hollow chamber, the trench structure laterally surrounding the cap region partially such that a connection structure remains connecting the cap region and the edge region; and
  removing the cap region in one piece from the bottom region and the edge region thereby cracking the support structure and the connection structure.

17. The method according to claim 1, further comprising:
processing a plurality of processing regions of the cap region, wherein at least a first processing region of the plurality of processing regions and a second processing region of the plurality of processing regions differ from each other in at least one of size or shape.

18. The method according to claim 1, further comprising:
forming a first electronic circuit structure with a first active area in the cap region, and
forming a second electronic circuit structure with a second active area in the cap region, wherein the first active area and the second active area differ from each other in at least one of size or shape.

19. A method for processing a carrier, the method comprising:
forming a hollow chamber within the carrier, the hollow chamber being covered by a cap region, wherein the cap region is supported via a plurality of support structure elements extending within the hollow chamber, wherein the plurality of support structure elements are spaced apart from each other with a first pitch;
processing a plurality of processing areas in the cap region, wherein the plurality of processing areas are spaced apart from each other with a second pitch, wherein the first pitch of the plurality of support structure elements is less than the second pitch of the plurality of processing areas.

20. A wafer comprising:
a hollow chamber within the wafer and a support structure extending within the hollow chamber, the hollow chamber being covered by a cap region, wherein the cap region is supported by the support structure, and wherein the hollow chamber undermines more than 80% of a processing surface of the wafer.

* * * * *